United States Patent [19]

Tamai et al.

[11] Patent Number: 5,512,106
[45] Date of Patent: Apr. 30, 1996

[54] SURFACE CLEANING WITH ARGON

[75] Inventors: Tadamoto Tamai, Tokyo; Yoichiro Ikeya, Houya, both of Japan

[73] Assignee: Sumitomo Heavy Industries, Ltd., Tokyo, Japan

[21] Appl. No.: 185,184

[22] Filed: Jan. 21, 1994

[30] Foreign Application Priority Data

| Jan. 27, 1993 | [JP] | Japan | 5-011519 |
| Feb. 22, 1993 | [JP] | Japan | 5-031950 |
| Mar. 30, 1993 | [JP] | Japan | 5-071777 |
| Apr. 8, 1993 | [JP] | Japan | 5-82234 |
| Jul. 30, 1993 | [JP] | Japan | 5-189541 |

[51] Int. Cl.$^6$ .................................................. B08B 7/00
[52] U.S. Cl. ................. 134/7; 134/2; 134/21; 451/39; 451/40
[58] Field of Search ............... 134/2, 7, 21; 51/321, 51/322; 451/39, 40

[56] References Cited

U.S. PATENT DOCUMENTS

| 5,062,898 | 11/1991 | McDermott et al. | 134/7 |
| 5,209,028 | 5/1993 | McDermott et al. | 134/7 X |
| 5,294,261 | 3/1994 | McDermott et al. | 134/7 |
| 5,366,156 | 11/1994 | Bauer et al. | 239/135 |
| 5,377,911 | 1/1995 | Bauer et al. | 239/135 |
| 5,378,312 | 1/1995 | Gifford et al. | 156/643 |
| 5,400,603 | 3/1995 | Bauer et al. | 62/51.1 |

FOREIGN PATENT DOCUMENTS

| 0461476A2 | 12/1991 | European Pat. Off. . |
| 0569708A1 | 11/1993 | European Pat. Off. . |

*Primary Examiner*—David L. Lacey
*Assistant Examiner*—Sean Vincent
*Attorney, Agent, or Firm*—Frishauf, Holtz, Goodman, Langer & Chick

[57] ABSTRACT

Argon gas and nitrogen gas are mixed together and cooled by a cooler to a liquefying temperature of argon gas specific to its pressure, to form argon fine droplets in the mixed gas. The gas is then jetted out of nozzles and blown into a vacuum chamber to adiabatically lower the temperature further and change fine droplets to solid fine particles which are used to clean the surface of an object.

26 Claims, 23 Drawing Sheets

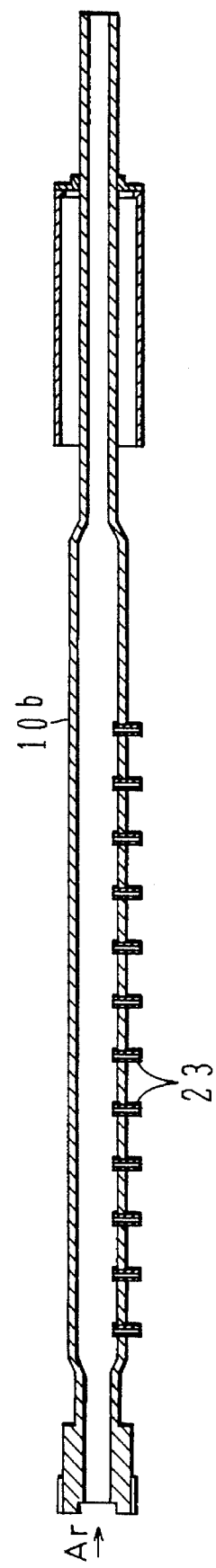

SURFACE CLEANING WITH ARGON

BACKGROUND OF THE INVENTION a) Field of the Invention

The present invention relates to a cleaning method and apparatus, more particularly to a cleaning method and apparatus suitable for cleaning the surface of a plane such as the surface of a semiconductor wafer.

At LSI manufacturing steps, fine particles or stains on the surface of a semiconductor wafer, an LCD, a solar battery or the like lower the final product yield considerably. Wafer surface cleaning is therefore important, and environmental contamination to be caused by cleaning is also an important issue.

b) Description of the Related Arts

Various cleaning methods have been proposed heretofore. Surface cleaning methods used heretofore for semiconductor wafers are summarized below.

Chemical Cleaning or Solvent Cleaning

This method removes surface stains by a chemical reaction or dissolution. Water, acid, organic solvent, freon, or the like is used. It is necessary to select proper solvents effective for stains, soils, and etc. to be removed. Ultrasonic cleaning may be used together to improve the physical cleaning power. It is necessary to use high purity solvent in order not to leave stains or soils on the cleaned object surface.

Water of high purity can be easily obtained and a great amount of water can be used cost effectively, but water left on the surface may cause future contamination, and the type of soils, stains, and the like to be dissolved by water is limited.

Many of other effective solvents contaminate the environment if they are left in the environment. In circulating solvents in order to prevent environmental contamination, it is difficult to refine circulating solvents cost effectively. If cleaning is repeated using the same solvent, contaminated substances are accumulated in this solvent and they may attach to the cleaned surface, resulting in defective products.

Fine Ice Particle Blowing

There is known a method of blowing fine ice particles to remove fine foreign particles or stains on an object surface. However, the diameter of a fine ice particle manufacturable presently is not sufficiently so small as to easily remove fine foreign particles of 1 μm or smaller.

Fine $CO_2$ Particle Blowing

There is also known a method of blowing fine dry ice particles to remove fine foreign particles or stains on an object surface. However, it is very difficult to extract hydro carbon compounds from carbon dioxide gas to a very low concentration. If $CO_2$ is cooled and blown, hydro carbon compounds are condensed and adhered to the cleaned surface. $CO_2$ may become a C contamination source.

Gas Blowing

There is a method of blowing gas to an object surface of a solid to clean it. However, a gas interface layer having a very slow flow is formed on the solid surface. Such a slow gas flow has a weak power of removing fine particles, being difficult to remove fine particles of 1 μm or smaller. The bond strength of a particle to the surface is proportional to its diameter, and the particle removing power is proportional to the square of a particle diameter.

Argon Gas Blowing at Extremely Low Temperature

A method of blowing argon gas or mixed gas containing argon gas cooled to an extremely low temperature to an object surface, is also known. By releasing gas from a nozzle to a vacuum chamber, the gas is adiabatically expanded rapidly and lowers its temperature. At this lowered temperature, solid argon is formed and solid argon fine particles collide against an object surface.

There has been proposed a method of transforming, for example, an argon gas to a solid argon by cooling the gas containing argon gas under a pressurized state to a temperate higher than the liquefying temperature of argon gas specific to its pressure, and by jetting the gas out of the nozzle to a vacuum chamber.

Impurities having a liquefying temperature higher than argon can be removed prior to cooling argon gas to the liquefying temperature. With this method, however, the number of solid argon fine particles is small, providing only a weak cleaning power.

Argon is an inert element and a bad effect rarely occurs even if it attaches to the solid surface. The solidifying temperature of argon is relatively high, and it is relatively easy to obtain solid argon by cooling argon gas.

However, a practical cleaning technique using solid argon fine particles has not been developed as yet which provides a high cleaning power.

SUMMARY OF THE INVENTION

It is an object of the present invention to provide a cleaning method and system using argon and providing a practically usable cleaning power.

It is another object of the present invention to provide a cleaning method and system using argon without lowering a cleaning process speed and without a fear of re-contamination in practical applications.

It is a further object of the present invention to provide a cleaning method and system using argon and providing a practically usable cleaning power, capable of removing contaminated foreign materials adhered to a fine groove or hole.

A fluid containing argon fine droplets is jetted out of a nozzle device to a depressurized atmosphere. The fluid is adiabatically expanded and at least a fraction of argon fine droplets is solidified and transformed into argon fine particles. The fluid containing argon fine particles is blown to the surface of a cleaning object to clean it.

Argon fine droplets may be formed by cooling a gas containing argon gas to the liquefying temperature or lower of argon gas specific to its pressure and by liquefying at least a fraction of the argon gas.

The temperature of a gas containing argon fine droplets can be lowered rapidly by jetting out the gas from a nozzle and adiabatically expanding it, and at least a fraction of the fine droplets can be solidified.

By blowing argon fine particles formed by the above method to the surface of a cleaning object, it is possible to clean the surface efficiently.

By cooling the gas containing argon gas to the liquefying temperature or lower of argon gas specific to its pressure, it is possible to form argon fine droplets in the mixed gas.

By cleaning a cleaning object with argon fine particles, it is possible to prevent re-contamination by the cleaning, and to prevent environmental contamination by the cleaning.

BRIEF DESCRIPTION OF THE DRAWINGS

FIG. 6 is a cross section showing the structure of another nozzle device.

DETAILED DESCRIPTION OF THE PREFERRED EMBODIMENTS

Figure 1:
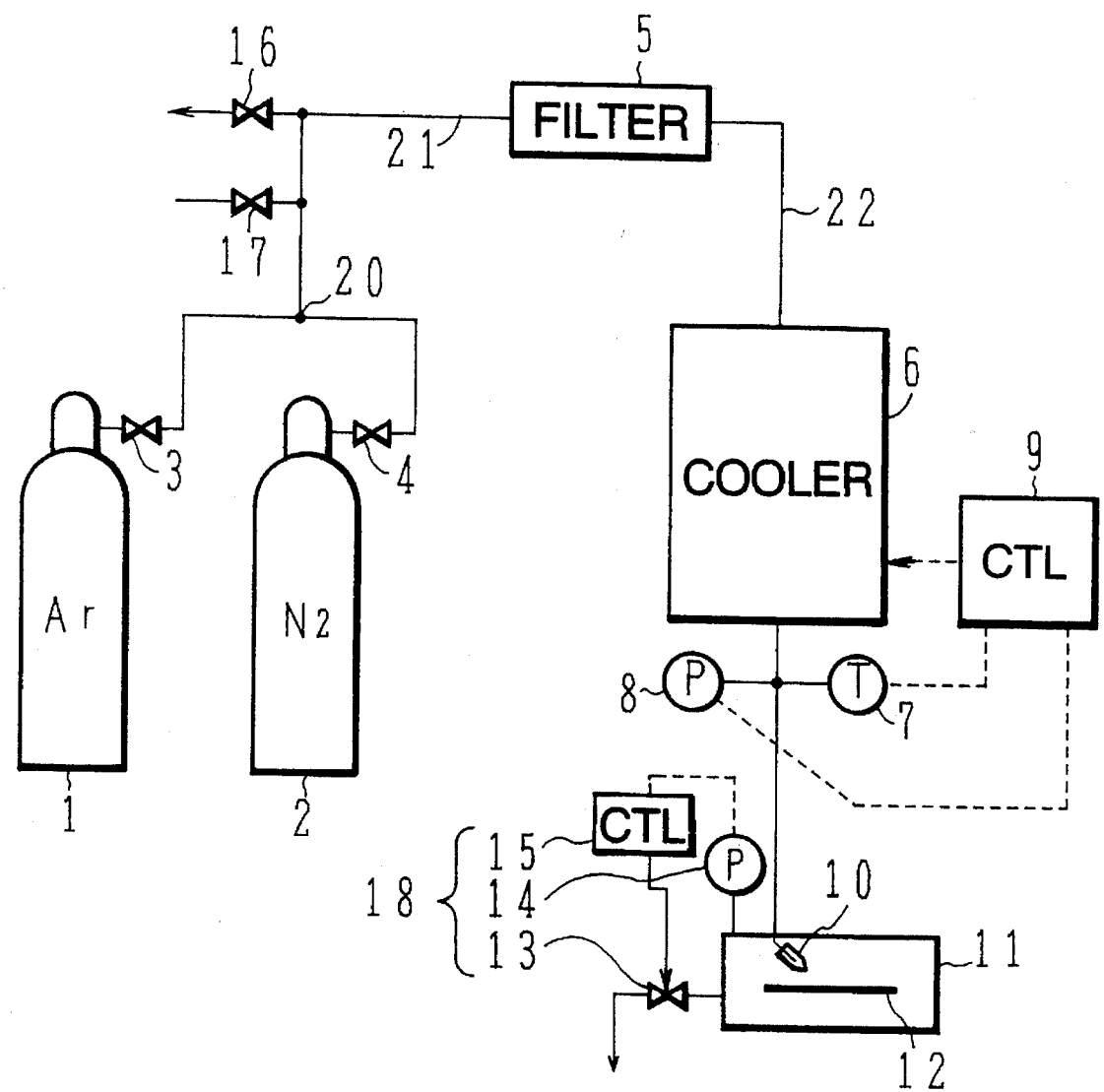
FIG. 1 is a schematic diagram showing the fundamental structure of a cleaning system using a surface cleaning method according to a first embodiment of the present invention.

FIG. 1 shows a cleaning system using a surface cleaning method according to the first embodiment of the present invention.

A bomb 1 containing argon (Ar) gas and another bomb 2 containing nitrogen ($N_2$) gas are connected via respective pressure regulate valves 3 and 4 and tubes to a junction point. An Ar and $N_2$ gas mixed at the junction point is supplied via a tube 21 to a filter 5 which removes foreign particles contained in the gas.

The mixed gas with particles removed is supplied via a tube 22 to a cooler (or heat exchanger) 6 which cools it. The cooled gas is jetted out of a nozzle device 10 into a vacuum chamber 11. The pressure and temperature of the mixed gas outputted from the cooler 6 are measured by a pressure gauge 8 and a temperature gauge 7, and the measured results in the form of electric signals are supplied to a temperature controller 9.

The temperature controller 9 controls the temperature of the mixed gas cooled by the cooler 6 to be lower than the than the liquefying or condensation temperature of argon gas specific to its pressure.

Figure 2:
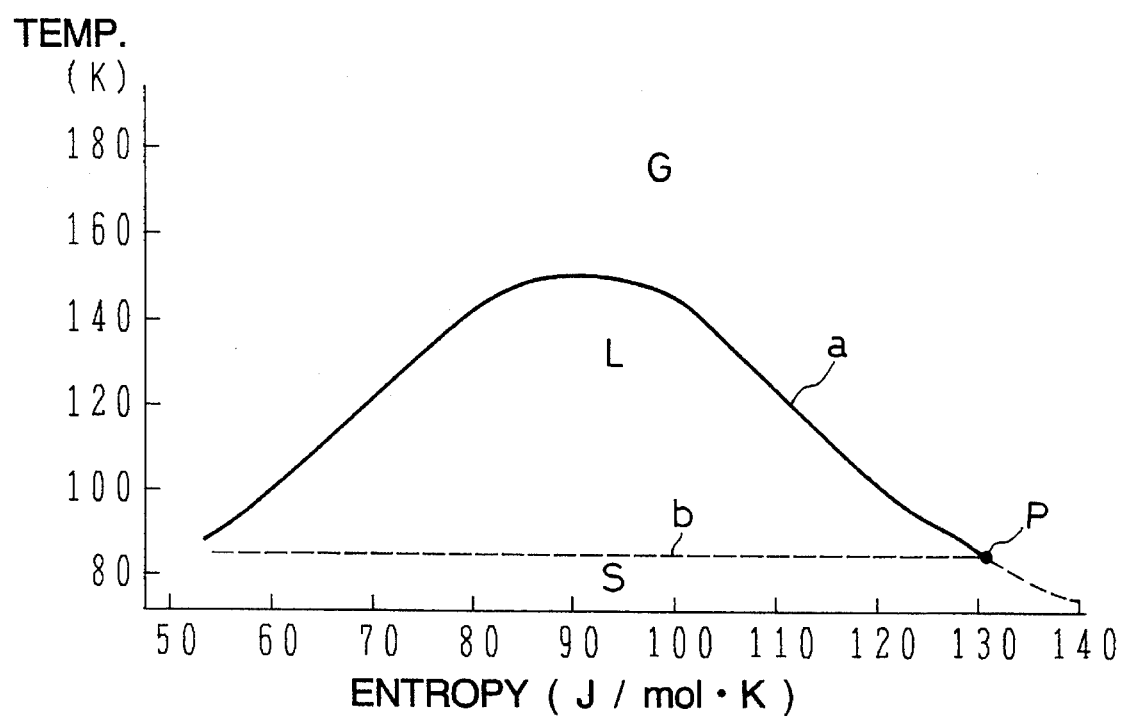
FIG. 2 is an argon phase diagram.

FIG. 2 is a phase diagram showing the liquefying temperature and solidifying temperature of argon gas, the abscissa representing an entropy in the unit of Joule/mol * K and the ordinate representing a temperature in the unit of absolute temperature K. In FIG. 2, G represents a gas phase, L represents a liquid phase, and S represents a solid phase. A curve a indicates the liquefying temperature (gas/liquid interface), a curve b indicates the solidifying temperature (liquid/solid interface), and a point P indicates the triple point of argon.

The temperature controller 9 shown in FIG. 1 controls the temperature of the mixed gas cooled by the cooler 6 to be equal to or lower than liquefying temperature of argon gas specific to its pressure shown in FIG. 2, in accordance with to the supplied pressure and temperature signals.

With this control, argon gas in the mixed gas is cooled and liquified, forming fine droplets.

It is preferable to set the nitrogen gas concentration to 2 to 70 mol %, because nitrogen gas has a larger specific heat than argon gas so that if the nitrogen gas concentration is set high, the heat quantity necessary for cooling gas becomes large. Even if the carrier gas is cooled excessively, it can be maintained gaseous if it contains nitrogen gas however less in amount it is, because the nitrogen liquefying temperature is lower than argon. This case can be realized because the liquefying temperature of nitrogen gas is lower than argon gas.

When the mixed gas is blown from the nozzle device 10 into the vacuum chamber 11, the mixed gas rapidly lowers its pressure and expands adiabatically. As a result, the temperature of the mixed gas lowers rapidly and the fine droplets change to argon fine particles having at least their surfaces solidified.

A fluid containing a number of argon fine particles is blown to the surface of an object 12 to be cleaned.

The vacuum chamber 11 is connected via a flow valve to a vacuum pump (not shown). A pressure gauge 14 is coupled to the vacuum chamber 11. A signal representing the pressure detected by the pressure gauge 14 is supplied to a pressure controller 15.

The pressure controller 15 controls the flow valve in accordance with the detected pressure. The pressure in the vacuum chamber 11 is maintained at a predetermined value by a vacuum pump means 18 constituted by the flow valve 13, pressure gauge 14, and pressure controller 15.

It is preferable to regulate the pressure valve 13 to set the pressure in the vacuum chamber between 0.2 ata (arms absolute) or higher and 0.7 ata or lower. More preferably, it is set to a pressure at the argon triple point (0.68 atmospheric pressure) or lower.

A proper pressure in the nozzle device 10 is determined in relation to the pressure in the vacuum chamber 11, and is preferably 3 ata to 7 ata.

If a pressure difference between the nozzle unit 10 and vacuum chamber 11 is small, a cooling effect is poor. The higher the pressure difference, the better the cleaning effect. If the pressure difference is made too large, argon fine particles blown from the nozzle device 10 float in the vacuum chamber 11, reducing the cleaning effect.

This phenomenon can be reasoned from the following.

At a small pressure difference, the degree of adiabatic expansion of mixed gas is small. It is conceivable therefore that argon fine droplets without being solidified collide against the cleaning surface, providing a low cleaning ability. At too large a pressure difference, the degree of adiabatic expansion of a mixed gas becomes large, lowering the temperature of the mixed gas too much. It is conceivable therefore that argon fine droplets solidified almost to the central areas of the droplets collide against the cleaning surface and elastically reflected from it, also providing a low cleaning ability.

At a proper pressure difference, it is conceivable that only the surface of an argon fine droplet is solidified and the inside of it is left in a liquid phase state. If an argon fine droplet solidified only at its surface like a shell collides against the cleaning surface, the shell is broken when colliding against the surface so that the elastic reflection will not occur, improving the cleaning effect.

If the pressure in the vacuum chamber 11 is set to the argon triple point or lower, argon cannot stay in the liquid phase so that at least the surface of an argon fine droplet is solidified. Therefore, by setting the pressure in the vacuum chamber 11 to the argon triple point or lower, an argon fine droplet can be reliably controlled to change to an argon fine particle with a shell.

Prior to introducing gas to the cleaning system, it is preferable that the system is evacuated via a valve 17 connected to the tube 21 to prevent the mixture of impurity gasses. It is also preferable to vent the mixed gas in the system after the cleaning by opening the valve 16 when the system is shut down.

Since the pressure at the upstream of the nozzle device 10 is maintained substantially constant, the pressure gauge 8 may be mounted at the upstream of the cooler 6.

In the above description, a mixed gas of argon and nitrogen is used and a fraction of the argon gas is changed to fine droplets which float in the nitrogen gas or a mixed gas. Instead, only argon gas may be used.

In such a case, a fraction of the argon gas is changed to fine droplets in the cooler 6 and the fine droplets are made to float in the remaining argon gas. In this case, argon gas having a concentration of several % to 100% can be used as the cleaning gas.

The cleaning object 12 in the vacuum chamber 11 may be heated. Of the gas containing argon fine droplets jetted out of the nozzle device 10, fine droplets having at least the solidified surfaces collide against the cleaning object 12. In this case, if the temperature of the cleaning object is higher than a certain temperature, argon fine particles or droplets attached to the surface of the cleaning object evaporate quickly.

In this manner, both the particle sandblast effect and the evaporation cleaning effect can be used. It is also possible to control the diameters of argon fine particles by adjusting the argon gas concentration and pressure, a cooling power, a cooling temperature, and the like.

In the first embodiment, only one cooler is used. Two or more coolers in cascade may also be used. For example, impurity gasses are liquified and removed at the first stage cooler, and argon gas is liquified at the second stage cooler.

In the first embodiment, argon gas is cooled to form argon droplets. Liquid argon may be used as the source of argon gas.

Figure 3:
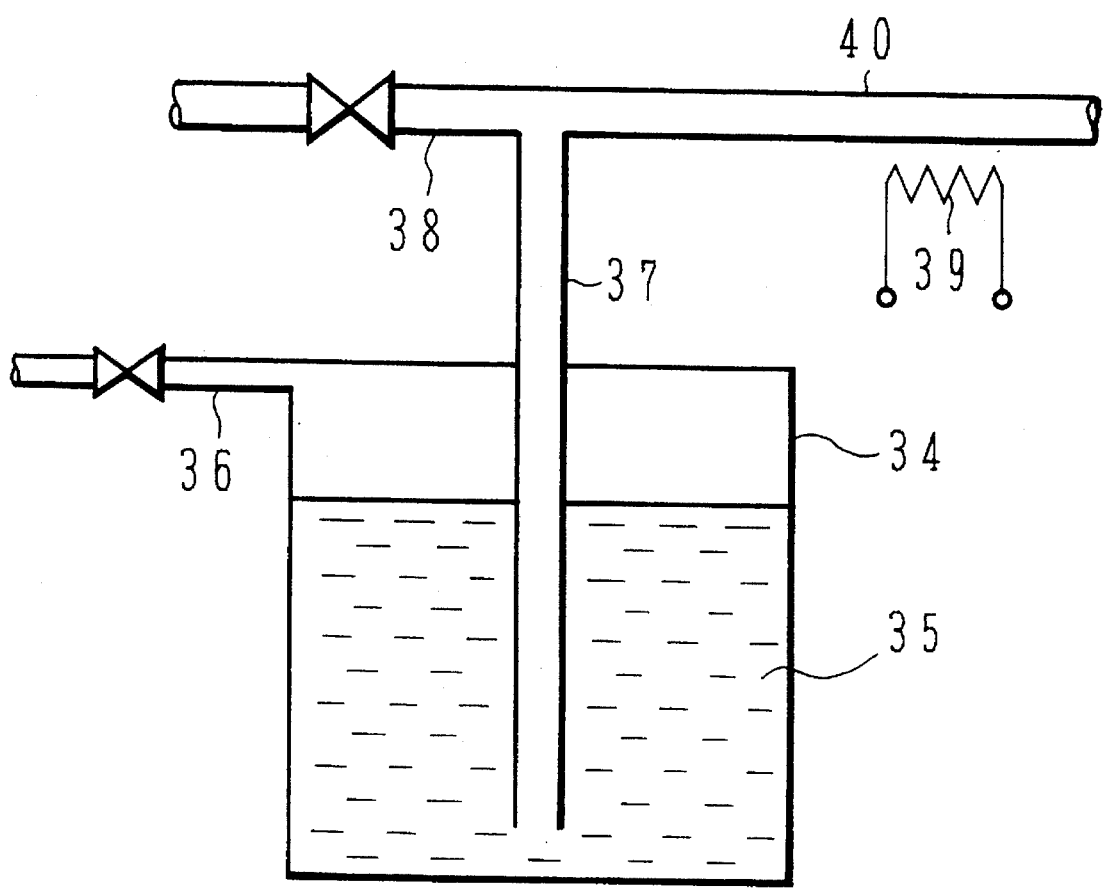
FIG. 3 is a schematic diagram partially in section illustrating an argon source for generating argon gas and argon fine droplets from liquid argon.

FIG. 3 illustrates an argon gas source using liquid argon. Liquid argon 35 is contained in a thermally isolated vessel 34. A tube 37 is inserted into the vessel 34 via the upper wall, and the tip of the tube 37 is immersed in the liquid argon 35. The tube 37 is bifurcated at the outside of the vessel 34, one side being connected via a tube 40 to the nozzle device 10 shown in FIG. 1 and the other side being connected to a tube 38 with a valve for introducing nitrogen gas.

A pressurizing tube 36 is open at the upper side of the vessel 34. The inside of the vessel 34 is pressurized by the pressurizing tube 36 or by the vapor pressure of the liquid argon 35 itself. As a result, tile liquid argon 35 is transferred via the tubes 37 and 40 to the nozzle device 10. Part of the liquid argon is heated during this transfer and gasified so that argon liquid droplets float in the argon gas.

Argon gas and liquid argon may be positively heated by providing a heating means 39 around the tube 40. By adjusting the heating quantity, the amount of gasified argon can be controlled.

The details of the nozzle device and other components will be described with reference to FIGS. 4 to 9.

Figure 4:
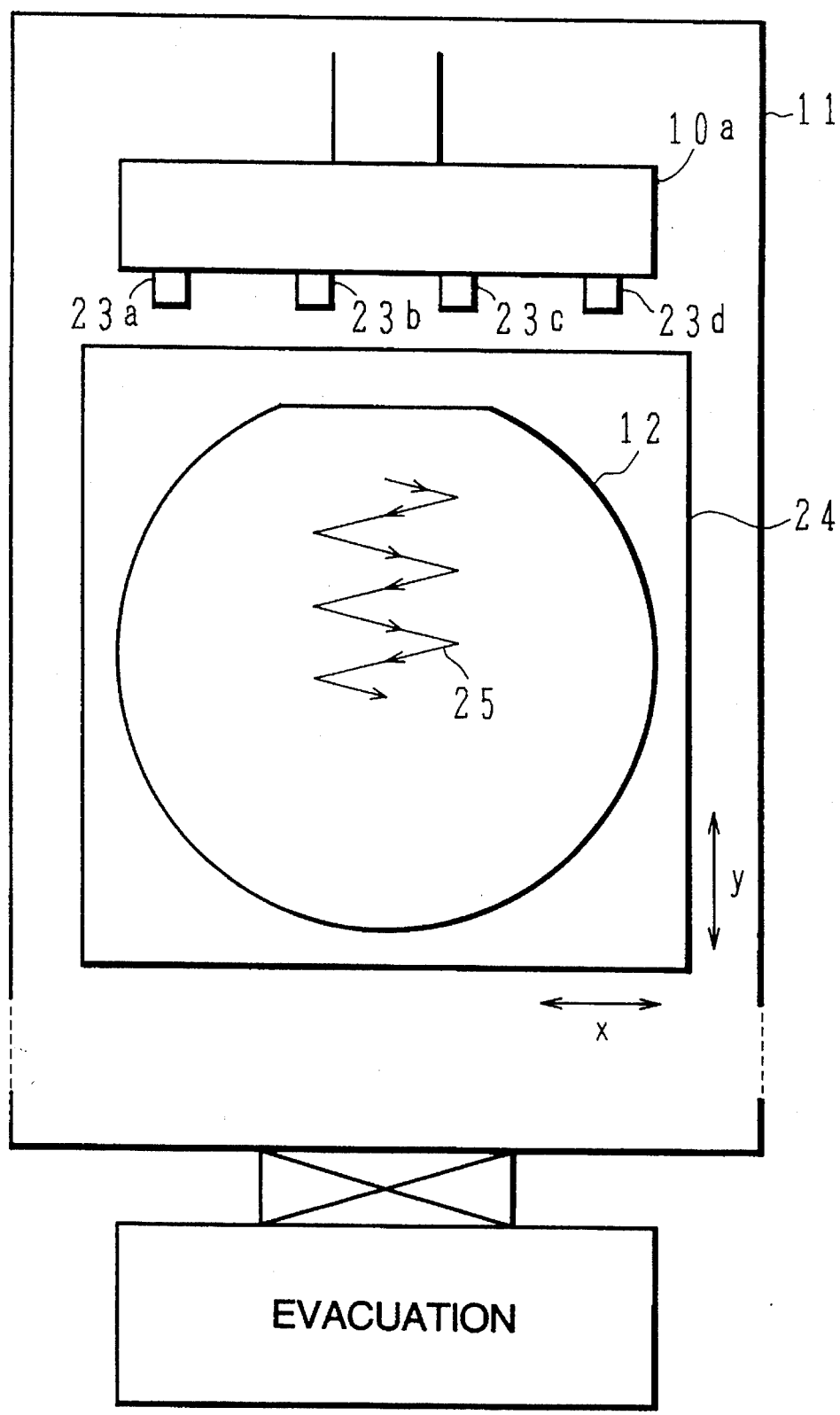
FIG. 4 is a schematic diagram showing the fundamental structure of components in a vacuum chamber of the cleaning system of the embodiment.

FIG. 4 shows the fundamental arrangement of the inside off the vacuum chamber 11. In the vacuum chamber 11, a nozzle device 10a having a plurality of nozzles 23a to 23d is provided, and a drive mechanism 24 for driving a cleaning object 12 such as a semiconductor wafer placed facing toward the nozzles. The drive mechanism 24 can be moved in the X-direction corresponding to the direction of disposing the nozzles 23a to 23d, and in the Y-direction perpendicular to the X-direction.

As the drive mechanism 24 moves the cleaning object 12 reciprocally in the X-direction at fast speed and straight in the Y-direction at low speed, a locus 25 of argon fine particles indicated by a zigzag arrow in FIG. 4 is formed on the surface of the cleaning object to clean the whole surface of it.

Components of the nozzle device and drive mechanism will be detailed below.

Figure 5A:
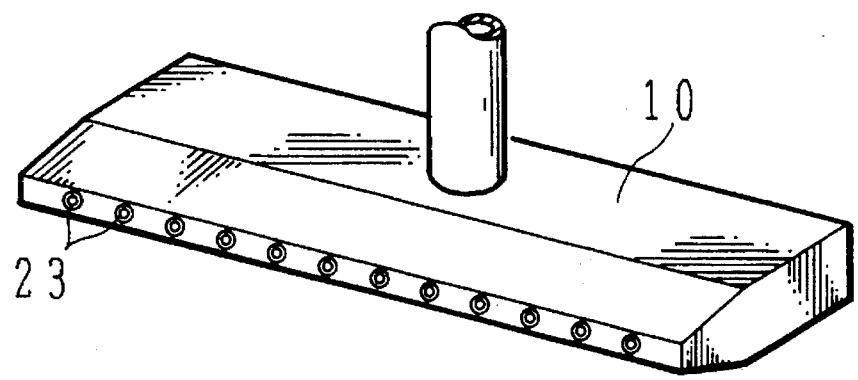
FIG. 5A is a perspective view showing the structure of a nozzle device.
Figure 5B:
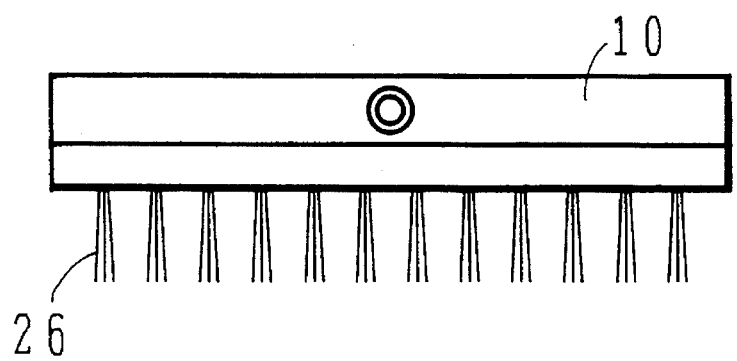
FIG. 5B is a front view of the nozzle device jetting out gas.

FIGS. 5A and 5B are diagrams illustrating a nozzle device. FIG. 5A is a perspective view of the nozzle device.

The nozzle device 10 has a plurality of nozzles 23, and is connected to a cooled argon gas source via a tube. The number of nozzles 23 is determined from the gas supply capacity of the cooled argon gas source and the like.

FIG. 5B illustrates argon gas flows jetted out of a plurality of nozzles. Each gas flow 26 jetted out of a nozzle diverges, but there is a gap between adjacent gas flows 26.

If the cleaning object is moved in the direction perpendicular to the direction of disposing nozzles of the nozzle device shown in FIG. 5A, a plurality stripe regions on the surface off the cleaning object can be cleaned, but the regions between stripe regions are not cleaned.

It is possible to increase the number of nozzles to clean the whole surface of the cleaning object by moving it in one direction. With this structure, however, the total amount of jetted-out argon gas becomes very large, and the system structure becomes bulky.

In this example of the nozzle device, a plurality of nozzles disposed at a predetermined interval shown in FIG. 5A is reciprocally moved at high speed in the X-direction and at low speed in the Y-direction. With this high speed X-direction reciprocal motion, the whole surface of the cleaning object can be cleaned.

FIG. 6 shows another example of the nozzle device.

Circular holes are formed in the wall of a cylindrical nozzle header 10b in line in the axial direction. A cylindrical nozzle 23, for example, 2 mm in outer diameter and 0.2 to 0.25 mm in inner diameter, is fitted in each circular hole. The inner surfaces of the nozzle header 10b and nozzle 23 are mechanochemically polished. One end of the nozzle header 10b is sealed, and gas containing argon fine droplets is supplied from the other end. Gas and argon fine droplets supplied to the nozzle header 10b are jetted out of the nozzles 23 by a pressure difference between the inner and outer spaces of the nozzle header 10b.

Figure 7A:
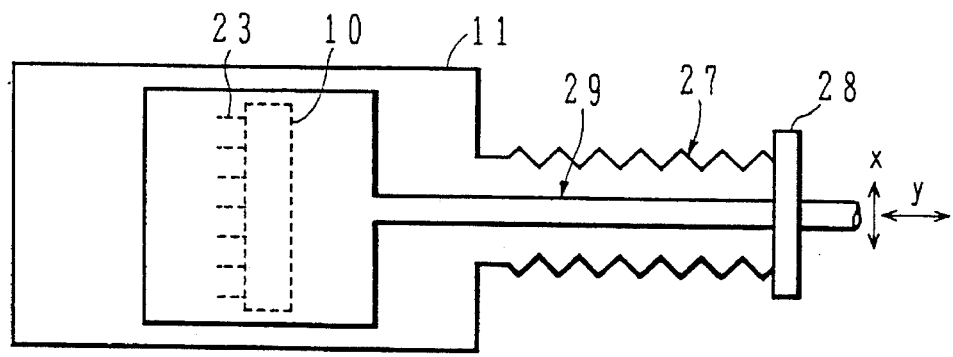
FIG. 7A is a schematic diagram showing the structure off a drive mechanism.
Figure 7B:
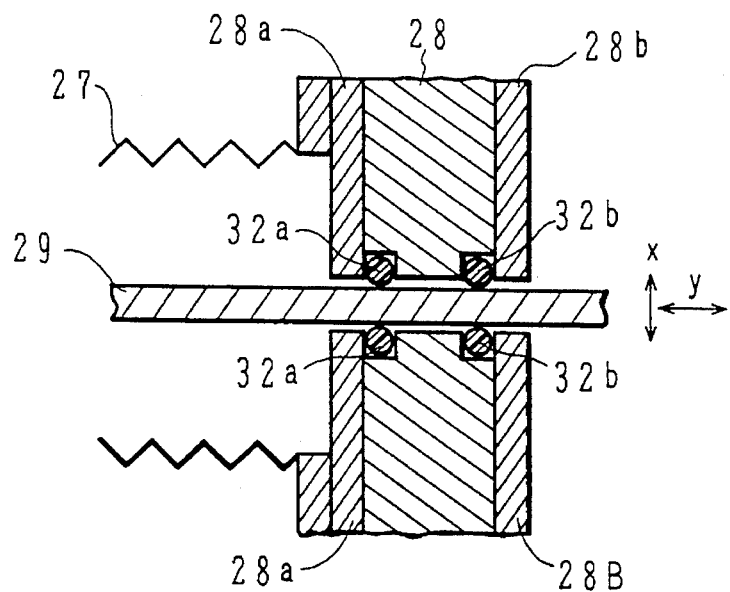
FIG. 7B is a cross section showing the flange of another drive mechanism.

FIGS. 7A and 7B show an example of the drive mechanism.

In FIG. 7A, a bellows 27 extends from a vacuum chamber 11 and is connected to a flange 28. The flange 28 is fixed to a support mechanism 29 which is driven by an external driver in the X- and Y-directions. The distal end of the support mechanism has a table for placing a cleaning object.

While a fluid containing argon fine particles jetted out of a plurality of nozzles 23 of a nozzle device 10, the support mechanism 29 is reciprocally moved at high speed in the X-direction and at low speed in the Y-direction. In this way, the whole surface of the cleaning object can be scanned by jet flows containing argon fine particles.

The flange 28 and support mechanism 29 fixed to the flange 28 are both driven in the X- and Y-directions, as described with FIG. 7A. The flange 28 may be fixed in the Y-direction, and only the support mechanism 29 is driven in the Y-direction.

FIG. 7B is a cross section of the flange in which the support mechanism 29 only is driven in the Y-direction.

As shown in FIG. 7B, the support mechanism 29 passes through a hole of the flange 28. O rings 32a and 32b are provided at the openings of the hole to seal the inside of the hole and the periphery of the support mechanism 29, and are pressed by flange pressure plates 28a and 28b. As a result, the support mechanism 29 can be driven in the Y-direction while maintaining the airtightness of the vacuum chamber 11.

The flange 28 and support mechanism 29 are both driven in the X-direction similar to FIG. 7A. With this arrangement, the flange 28 can be fixed in the Y-direction.

The drive width in the X-direction is in the same order as the interval of nozzles, and the drive width in the Y-direction is, for example, about 6 inches for cleaning an 6-inch wafer. With the method illustrated in FIG. 7B, it is not necessary to drive the flange 28 in the Y-direction, by driving it with only the small drive width in the X-direction. Therefore, the expansion/contraction span of the bellows 27 is small, improving the reliability of the bellows.

Figure 7C:
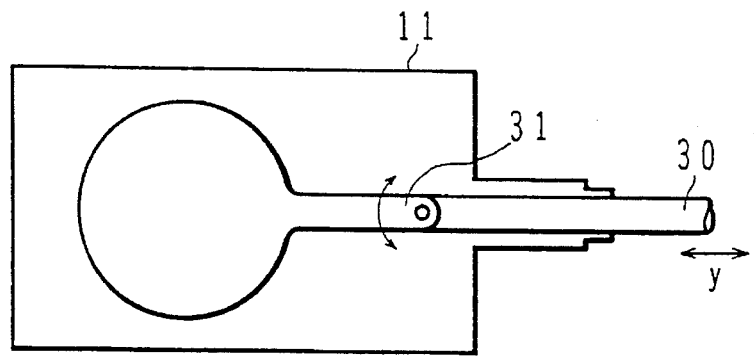
FIG. 7C is a schematic diagram showing the structure off another drive mechanism.

FIG. 7C shows another example of the drive mechanism. A slidable arm 30 is mounted on one side of a vacuum chamber 11 while maintaining the airtightness of the chamber in the similar manner described with FIG. 7B. The arm 30 is moved in the Y-direction by an external driver. A table 31 is supported at the end of the arm, and is made to reciprocally rotate.

While the table is reciprocally rotated at high speed, the arm 30 is moved in the Y-direction at low speed. In this manner, the same function as FIG. 7A can be obtained. A gas ejecting mechanism is omitted in FIG. 7C.

Figure 8:
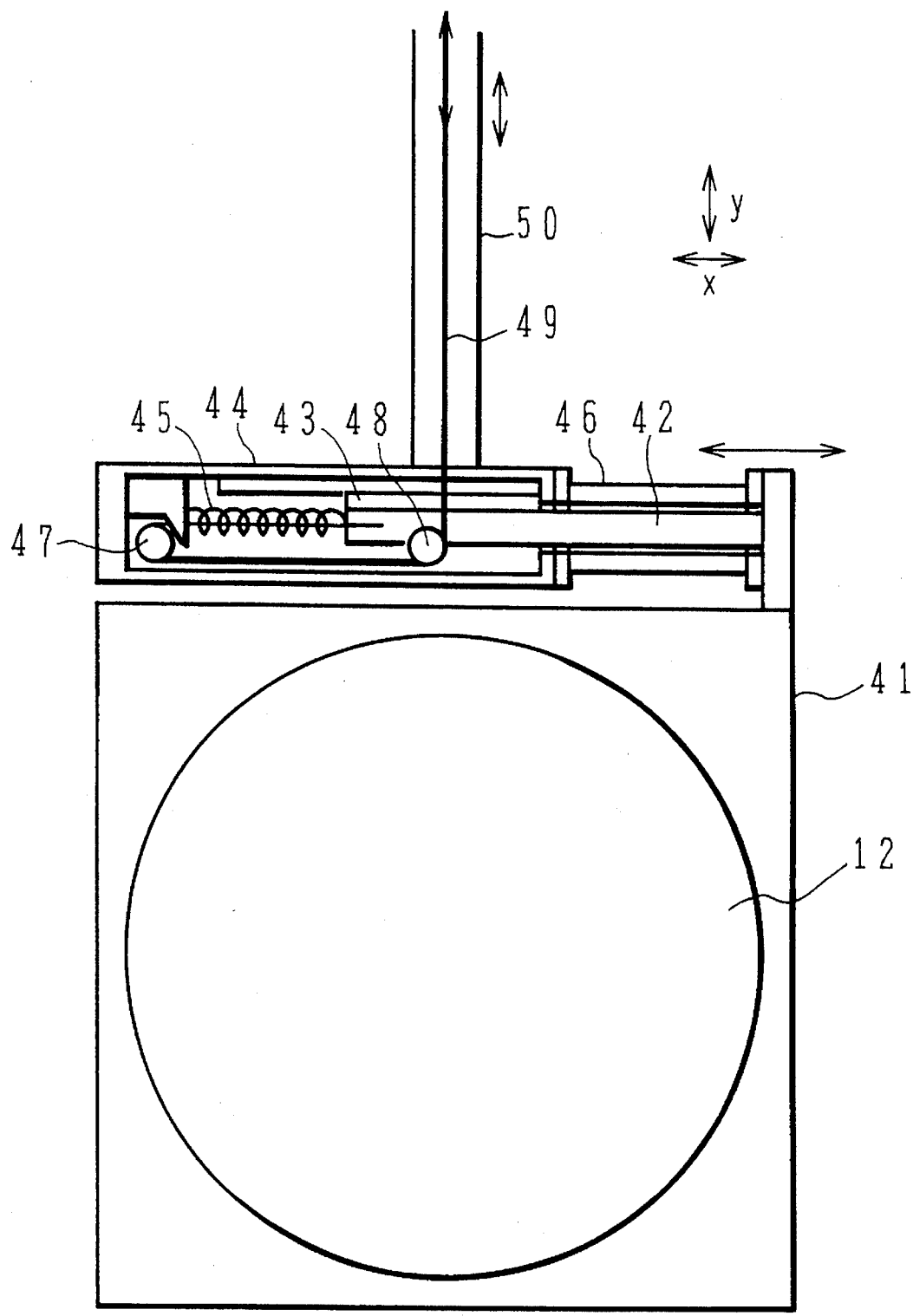
FIG. 8 is a schematic diagram showing the structure of another drive mechanism.

FIG. 8 shows another example of the drive mechanism. A substrate holder 41 has an arm 42 which is fixed to the holder 41 at its upper projecting shoulder. The arm 42 is coupled via a linear bearing 43 to a guide frame 44. The substrate holder 41 is thereby supported movable in the X-direction by the linear bearing 43. A bellows 46 is mounted around the arm 42.

A spring 45 is extended between the left end of the guide frame 44 and the arm 42 to energize the arm 42 to the right. A pulley 47 is mounted on the guide frame 44, and another pulley 48 is mounted on the guide frame 44. A wire 49 connected to the tip of arm 42 extends upward via the pulley 47 and 48.

As the wire 49 is pulled upward, the arm 42 causes the arm 42 and hence the substrate holder 41 to move to the left. As the wire 49 is loosened, the substrate holder 41 moves to the right by the force of the spring 45.

A support arm 50 is fixed to the guide plate 44, and driven in the Y-direction by another drive mechanism. As the support arm 50 is driven in the Y-direction, the substrate holder 41 moves in the Y-direction.

In the above manner, by driving the support arm 50 and wire 49, the substrate holder 41 can be moved in the X- and Y-directions.

The substrate holder 41 with a cleaning object 12 is moved in the Y-direction at low speed by driving the support arm 50 and reciprocally moved in the X-direction at high speed by using the wire 49. In this manner, the whole surface of the cleaning object 12 can be cleaned by a plurality of flows containing argon fine particles jetted out of the nozzle device such as shown in FIGS. 5A, 5B, and 6.

Figure 9:
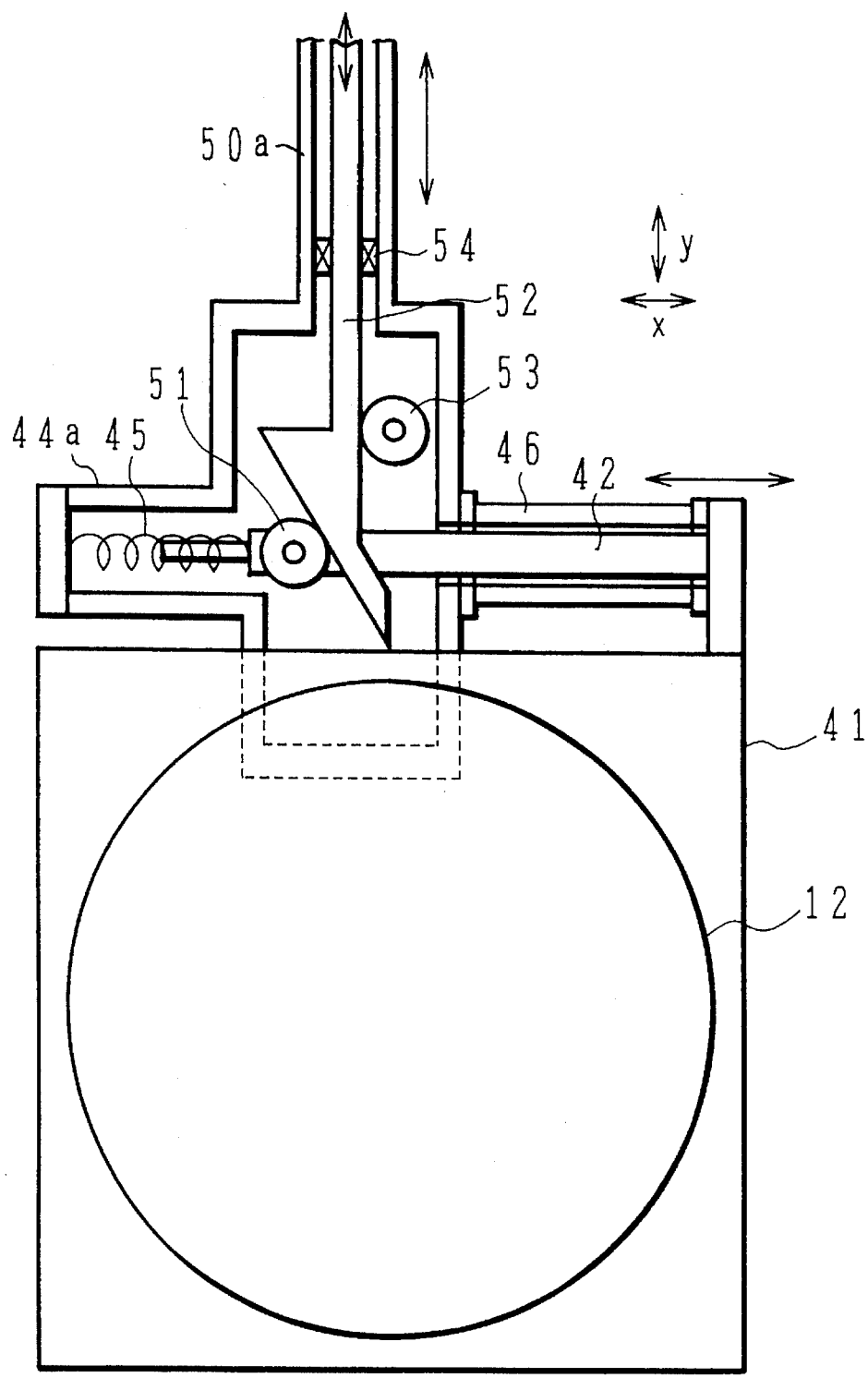
FIG. 9 is a schematic diagram showing the structure of another drive mechanism.

FIG. 9 shows another example of the drive mechanism. A substrate holder 41, and arm 42, a spring 45, and a bellows 46 have the same structures as FIG. 8. A guide frame 44a has a hollow support arm 50a in which an arm 52 with a cam mechanism is housed. A roller 51 is mounted on the arm 42 and engages with a cam of the arm 52. A roller 53 and a bushing 54 support the linear motion of the arm 52.

As the support arm 50a is moved in the Y-direction, the substrate holder 41 is moved in the Y-direction. As the arm 52 in the support arm 50a is reciprocally moved in the Y-direction, the substrate holder 41 is reciprocally moved in the X-direction by means of the cam mechanism. In this way, the substrate support mechanism movable in the X- and Y-directions can be realized.

The motion in the X- and Y-directions follows the locus 25 shown in FIG. 4 so that gas flows jetted out of the nozzle 23 trace the surface of a cleaning object in a zigzag locus.

In this case, the motion speed in the Y-direction is controlled so as to allow adjacent zigzag loci to contact each other or partially superpose one upon the other.

The motion width in the X-direction is also regulated so as to allow adjacent loci of gas flows jetted out of the nozzles to contact each other or partially superpose one upon another. Namely, the reciprocal motion width in the X-direction is preferably set to the distance between adjacent nozzles, or greater.

Even if the motion width in the X-direction is not greater than the distance between adjacent nozzles, a continuous cleaning surface can be obtained if it is greater than the distance between adjacent nozzles subtracted by the diameter of a jet gas flow. The latter distance is intended in this specification to include the distance between adjacent nozzles.

As described above, the whole surface of a cleaning object can be cleaned by jet gas flows having a proper gas amount, by a combination off gas flows jetted out of a plurality of nozzles of a nozzle device, arid the two-dimensional drive mechanism for a cleaning object.

A second embodiment of the present invention will be described.

The surface of a cleaning object blown with an extremely low temperature flow containing argon fine particles is cooled rapidly in a short time, and may sometimes damaged by a thermal distortion caused by a temperature difference between the surface and the inside of the cleaning object. Furthermore, if the cleaning object is exposed in air immediately after the cleaning by blown argon fine particles, moisture in the air makes dews and frosts on the surface of the low temperature cleaning object. In order to avoid dews and frosts, it is necessary to raise the temperature of the cleaning object gradually to the room temperature, which prolong the cleaning process time and lowers the productivity.

If a cleaning object is heated by a heater or the like from the bottom of it, the object is thermally deformed posing a problem of warping the object. The second embodiment solving the above problems will be described below.

Figure 10:
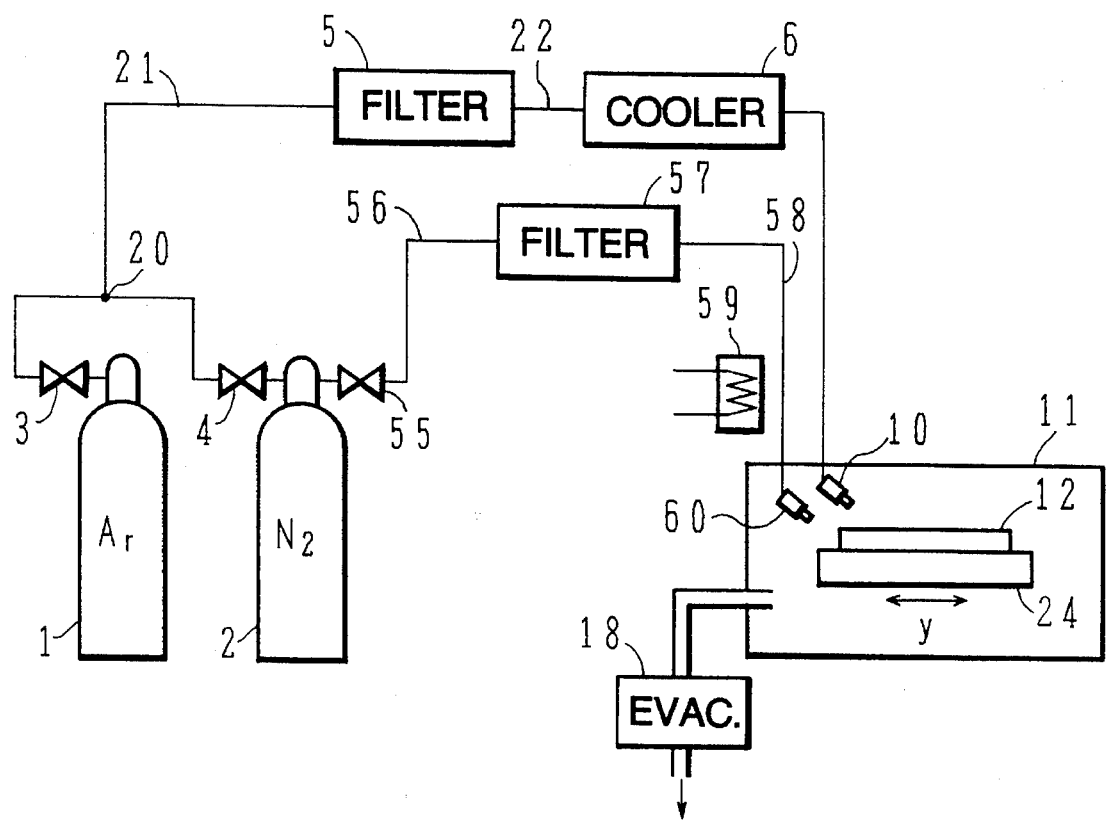
FIG. 10 is a schematic diagram showing the fundamental structure of the cleaning system according to a second embodiment of the present invention.

FIG. 10 shows a fundamental structure of the cleaning system according to the second embodiment of the present invention. The structures of components from an argon gas bomb 1 and a nitrogen gas bomb 2 to a nozzle device 10 in a vacuum chamber 11 via a filter 5 and a cooler 6, and the structures of a drive mechanism 24 in the vacuum chamber 11, a cleaning object 12, and a vacuum pump means 18, are similar to the first embodiment shown in FIG. 1.

The nitrogen gas bomb 2 is connected via a tube 56 having a pressure valve 55 to another filter 57 which removes foreign particles in the nitrogen gas.

The nitrogen gas with foreign particles removed is supplied via a tube 58 to another nozzle device 60 and blown into the vacuum chamber 11. A heater 59 is mounted near, or in, the tube 58 to heat the nitrogen gas. The outlets of the nozzle devices 10 and 60 are disposed at near positions. The heater 59 heats the nitrogen gas, preferably, to about the room temperature or higher when it is adiabatically expanded in the vacuum chamber.

While jetting out an argon mixed gas from the nozzle device 10, the cleaning object 12 is moved slowly in the Y-direction shown in FIG. 10 toward the nozzle devices by using the drive mechanism 24 so that the surface of the cleaning object 12 is scanned in the Y-direction by extremely low temperature argon fine particles jetted out of the nozzle device 10. Flows containing low temperature argon fine particles hit contaminated materials on the surface of the cleaning object 12 and remove them. At the same time, the surface of the cleaning object is cooled to a low temperature.

Nitrogen gas is jetted out of the nozzle 60 to the surface of the cleaning object cooled by the cleaning process. Since this nitrogen gas has been heated by the heater 59 to near the room temperature or proper temperature, the temperature of the cooled surface of the cleaning object rises, preferably to near the room temperature.

The cleaning object is heated to about the room temperature or higher by the nitrogen gas immediately after the cleaning by argon fine particles. Therefore, even if the cleaning object 12 is transported to the outside of the vacuum chamber 11 immediately after the cleaning, no dew or frost is generated nor the cleaning object 12 is damaged by the thermal distortion to be caused by the temperature difference. A warp problem is less because the entirety of the cleaning object is not heated by a heater.

Figure 11:
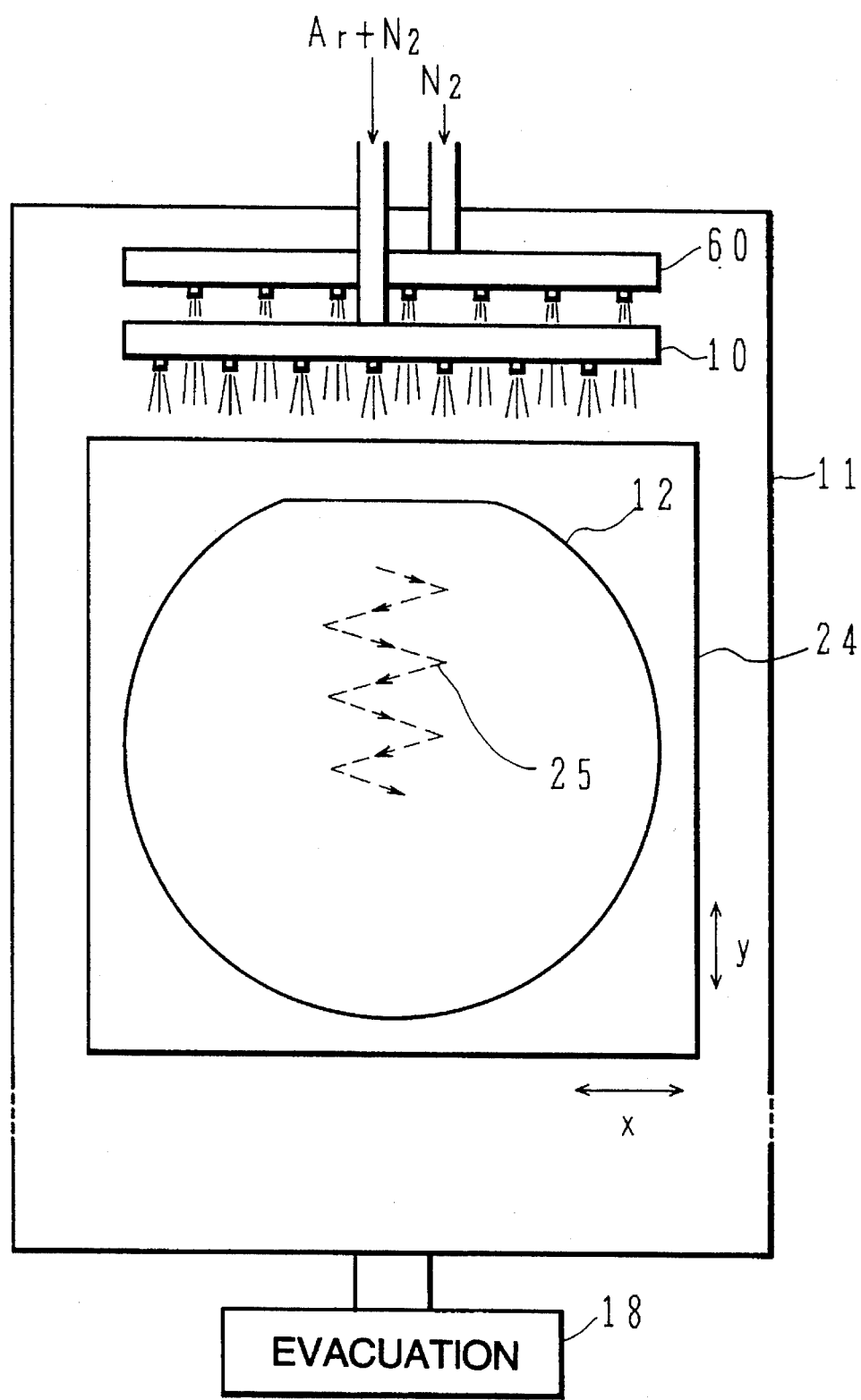
FIG. 11 is a plan view of the vacuum chamber of the cleaning system of the second embodiment.

FIG. 11 shows the structure of the inside of the vacuum chamber 11 as viewed from the top of it.

The nozzle device 10 has a plurality of nozzles disposed in line in the X-direction. A mixed gas of Ar and $N_2$ is supplied from the cooler 60 to the nozzle device 10. The other nozzle device 60 at the back of the nozzle device 10 has also a plurality of nozzles disposed in line in the X-direction.

The nozzles of the nozzle devices 10 and 60 are positioned alternately as shown in FIG. 11. This positioning is effective for providing the interference between the cooled mixed gas flows of $Ar+N_2$ and the heating $N_2$ gas flows as much as possible.

As the cleaning object 12 is reciprocally moved in the X-direction at high speed and in the Y-direction toward the nozzles at low speed by the drive mechanism, a locus 25 schematically indicated by a zigzag arrow in FIG. 11 is formed by argon fine particles and the heating gas flow. Accordingly, the whole surface of the cleaning object can be uniformly cleaned and the cooled surface can be heated to near the room temperature. The same effects can be obtained by fixing the cleaning object 12 and moving the nozzle devices 10 and 60.

Figure 12:
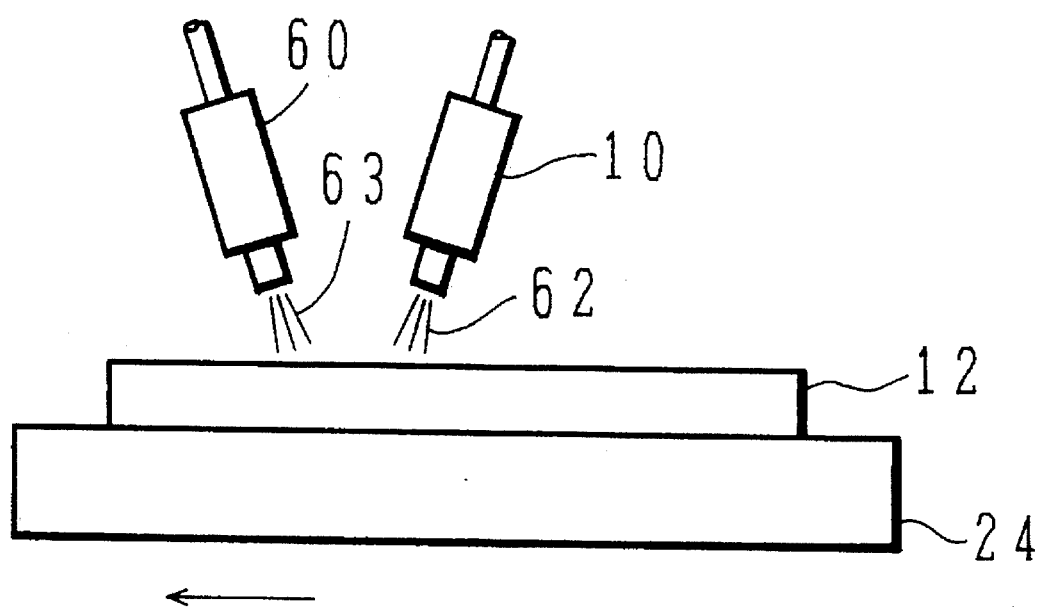
FIG. 12 is a schematic diagram illustrating the state off blowing a cleaning argon mixed gas and a heating gas.

The above embodiment, the argon mixed gas and heating gas are blown to the cleaning object from the same direction. The blowing directions of the nozzle devices may be different as shown in FIG. 12. Specifically, the argon mixed gas flows 62 are blown from a first nozzle device 10 from the right, whereas the heating gas flows 63 are blown from a second nozzle device 60 from the left, and the drive mechanism is operated from the right to the left.

The surface of the cleaning object 12 is first cleaned and cooled, and thereafter heated.

In the above description of the second embodiment, the disposal of nozzles and the number of nozzles are shown only by way of example and are not intended to be limitative, but they can be selected and changed as desired depending upon the shape and size of a cleaning object 12. Further, instead of the heating nitrogen gas, other gasses such as inert gas may also be used.

In the above description, heating is performed after cleaning and cooling. Cleaning may be performed after heating while maintaining the surface of a cleaning object near at the room temperature.

Next, the third embodiment of the present invention will be described.

Figure 22A:
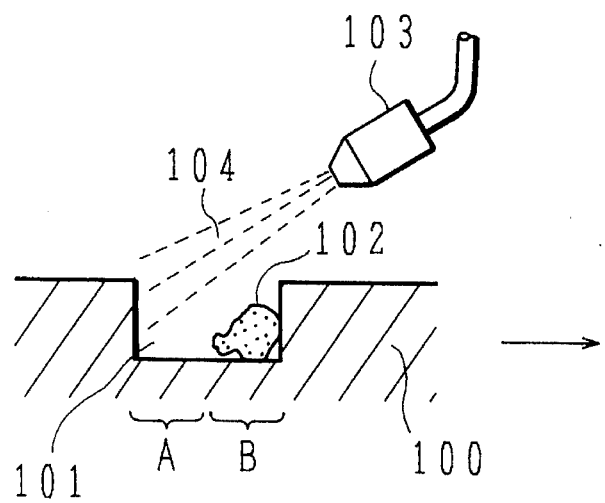
FIG. 22A is an enlarged cross section explaining the cleaning in which the nozzle jetting direction is fixed to one direction.

The surface of a semiconductor wafer or the substrate of a liquid crystal display has a fine uneven pattern. Consider as shown in FIG. 22A the case where a contaminated material 102 is adhered to a fine groove 101 formed on the surface of a semiconductor wafer 100, and the wafer 100 is moved in the arrow direction while blowing argon fine particles 104 from a nozzle device 103 to the surface of the wafer 100.

In such a case, contaminated materials on the area A in the groove 101 are blown out by argon fine particles, but argon particles will not collide against contaminated materials on the area because the obstruction of the wall of the groove 101.

Figure 22B:
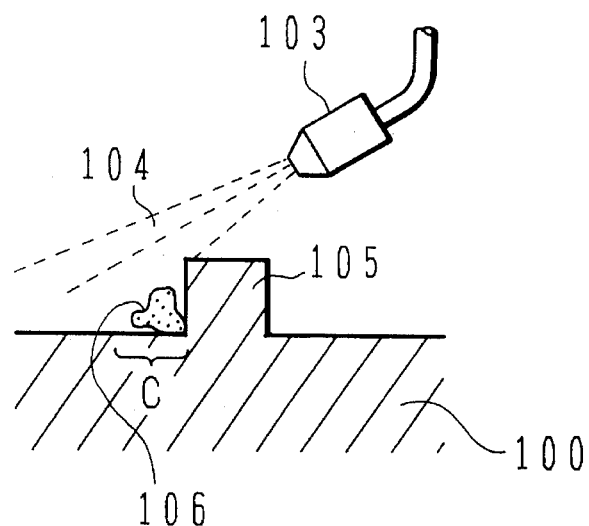
FIG. 22B is an enlarged cross section explaining the cleaning in which the nozzle jetting direction is fixed to one direction.

Also in the case shown in FIG. 22B where a projection 105 is formed on the surface of the wafer 100, contaminated materials 106 at the area C where the projection 105 obstructs the flow direction of the nozzle device 103, are difficult to be removed. The third embodiment solving the above problems will be described below.

Figure 13A:
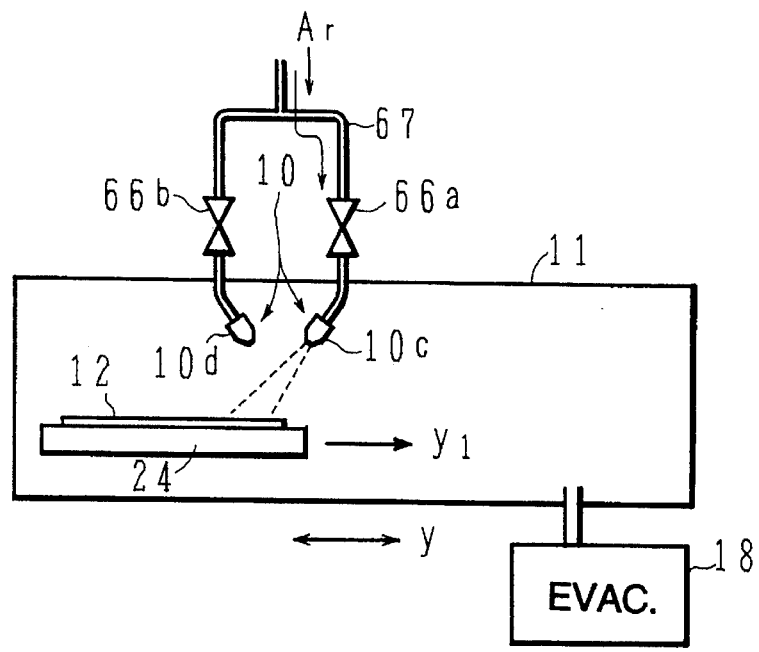
FIG. 13A is a schematic diagram showing the fundamental structure of a vacuum chamber of the cleaning system according to a third embodiment of the present invention.
Figure 13B:
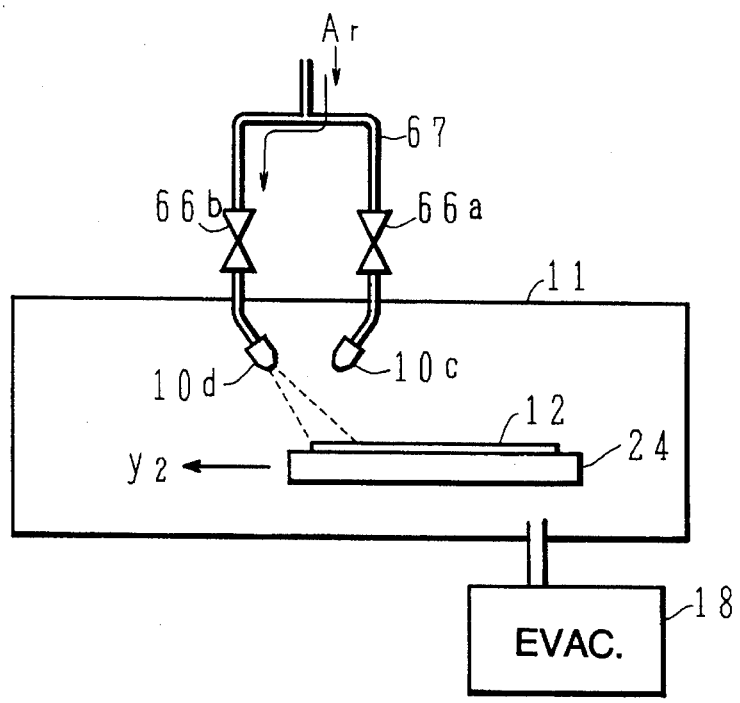
FIG. 13B is a schematic diagram showing the fundamental structure off the vacuum chamber of the cleaning system of the third embodiment.

FIGS. 13A and 13B show the fundamental structure of the inside of a vacuum chamber 11 of the cleaning system according to the third embodiment of the present invention.

The vacuum chamber 11 hermetically sealed is connected to a evacuating device 18 such as a vacuum pump by which the inside of the chamber is evacuated. Mounted in the vacuum chamber 11 are a nozzle device 10 disposed with a plurality of nozzles and a drive mechanism 24 for supporting a cleaning object 12 such as a semiconductor wafer by facing it toward the nozzle device 10. The drive mechanism 24 can be moved in the Y-direction shown in FIG. 13A and in the X-direction (perpendicular to the surface of the drawing sheet) of disposing a plurality of nozzles orthogonal to the Y-direction.

The argon gas jetting nozzle device 10 is connected via shut-off valves 66a and 66b and a bifurcated tube 67 to a gas supplying means constituted by the similar components to the first embodiment shown in FIG. 1 including the bombs 1 and 2, filter 5, and cooler 6. The nozzle device 10 jets out a fluid containing argon fine particles from a plurality of nozzles into the vacuum chamber 11. The nozzle device 10 has two nozzle arrays 10c and 10d whose blowing directions intersect in the plane of the drawing sheet as shown in FIG. 13A.

Figure 14:
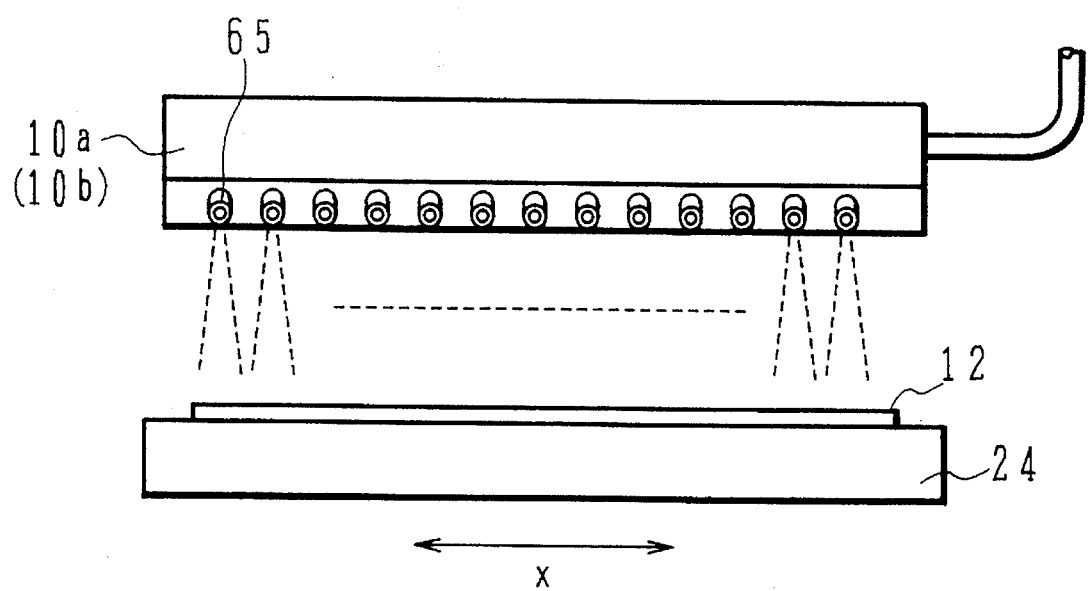
FIG. 14 is a front view of the nozzle device and drive mechanism of the cleaning system shown in FIG. 13A.

FIG. 14 shows the nozzle array 10c (10d) of FIGS. 13A and 13B as viewed in the Y-direction. The nozzle array 10c (10d) has a plurality of nozzles 65 disposed in line in the X-direction. In the nozzle device shown in FIG. 14, the direction of jetting argon fine particles from the nozzle 65 is at generally a right angle relative to the cleaning object as viewed in the Y-direction.

Referring to FIG. 13A, the shut-off valve 66b is closed and the shut-off valve 66a is opened. While jetting out argon gas from a plurality of nozzles 65 of the nozzle array 10c into the vacuum chamber 11, the cleaning object 12 is moved in the Y1-direction shown in FIG. 13A slowly by the drive mechanism 24 so that argon fine particles are jetted out from the nozzle array 10c to the whole surface of the cleaning object 12.

If there is a gap between adjacent argon gas jet flows, the drive mechanism 24 is swung in the X-direction rapidly and in the Y-direction slowly to thereby blow the argon gas jet flows uniformly over the whole surface.

After the whole surface of the cleaning object 12 is cleaned by using the nozzle array 10c while moving the object the Y1-direction, the shut-off valve 66a is closed and the shut-off valve 66b is opened. While jetting out argon fine particles from the nozzle array 10d in the direction shown in FIG. 13B, the cleaning object 12 is moved in the Y2-direction slowly by the drive mechanism 24 so that argon fine particles are jetted out from the nozzle array 10d to the whole surface of the cleaning object 12. With a combination of the processes shown in FIGS. 13A and 13B having the jet directions intersecting in the plane of the drawing sheets, it is possible to completely clean the whole surface of the cleaning object 12, including the uneven area such as a groove.

Figure 15A:
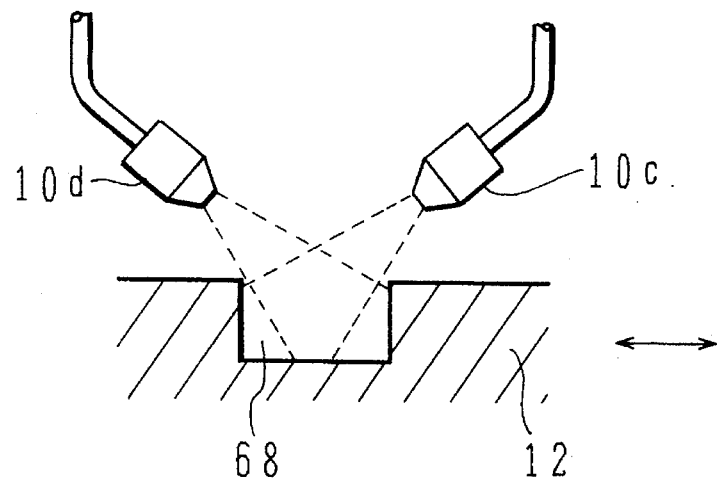
FIG. 15A is an enlarged cross section of a cleaning object explaining the cleaning method of the third embodiment.

FIG. 15A is a schematic diagram partially in section wherein the inner surface of a fine groove 68 formed on the surface of a cleaning object 12 is cleaned by using the nozzle device shown in FIGS. 13A and 13B. By blowing argon fine particles in different directions at the same time, all contaminated materials can be removed by cleaning the inner surface of the groove 68 by argon fine particles.

Figure 15B:
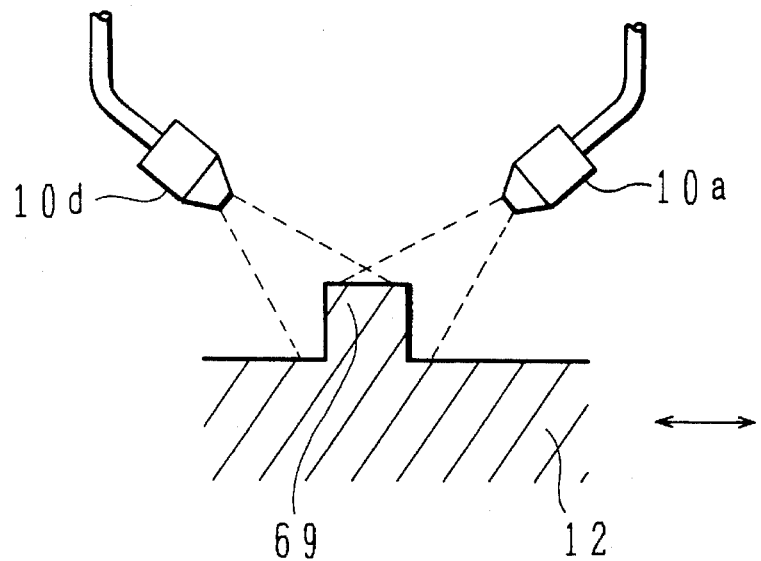
FIG. 15B is an enlarged cross section of a cleaning object explaining the cleaning method off the third embodiment.

FIG. 15B is a schematic diagram partially in section wherein the surface of a fine projection 69 formed on the surface of a cleaning object 12 is cleaned by using the nozzle device shown in FIGS. 13A and 13B. Also in this case, by blowing argon fine particles in different directions at the same time, all contaminated materials can be removed by cleaning the surface of the projection 69 by argon fine particles.

If the degree of contamination is great, a cleaning object 12 is reciprocally moved in the Y-direction and the switching process between the nozzles 10c and 10d is performed a plurality of times, resulting in an improved cleaning effect.

Figure 16:
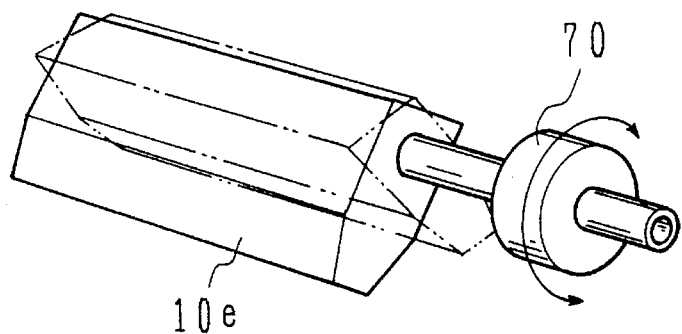
FIG. 16 is a schematic perspective view illustrating the nozzle device according to another embodiment.

FIG. 16 illustrates another embodiment of the nozzle device 10. In this embodiment, the nozzle device 10 is constructed of one nozzle array 10e and a nozzle array rotating unit 70. The rotating unit 70 is structured such that while hermetically sealing the tube and nozzle array 10e, the nozzle array lee is rotated in the arrow direction by a driving means such as a stepping motor.

By using the nozzle array 10e shown in FIG. 16 and changing the jet direction of argon fine particles, it is possible to attain the same function and effects as the embodiment explained with FIGS. 13A, 13B, and 14. In this embodiment, if the jet angle of the nozzle array 10e is made continuously changeable, a more proper jet angle matching the surface pattern shape of a cleaning object can be obtained. If the jet angle of the nozzle array 10e is flapped in the arrow direction while jetting out argon fine particles, a more effective cleaning can be expected.

Figure 17:
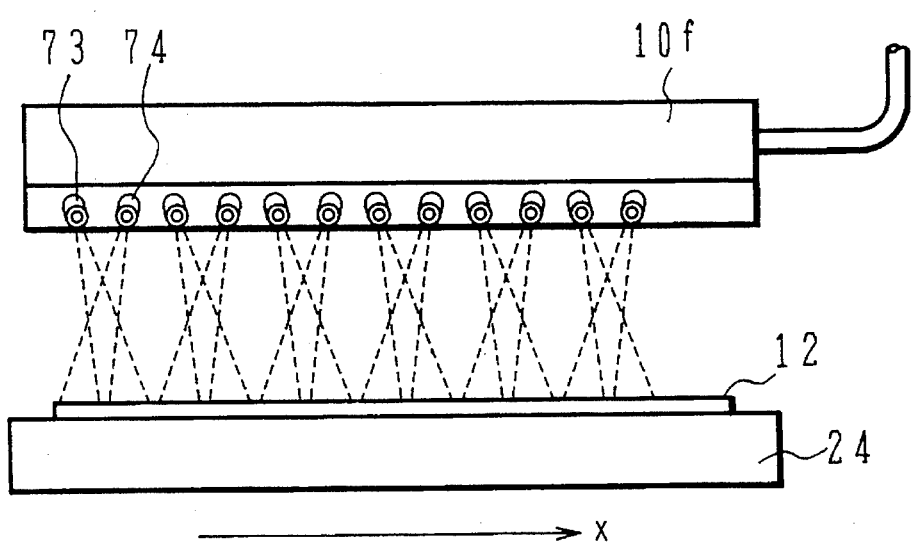
FIG. 17 is a schematic perspective view illustrating the nozzle device according to another embodiment.

FIG. 17 shows another example of the nozzle device having a different disposal of nozzles. The blow direction of the nozzles 65 of the nozzle device shown in FIG. 14 is at a right angle relative to a cleaning object 12 as viewed in the Y-direction. In the nozzle array 10f shown in FIG. 17, each pair of adjacent nozzles 73 and 74 facing at a predetermined angle blows argon fine particles toward a cleaning object 12. Other pairs of adjacent nozzles are structured in the same manner. In this embodiment, also the vertical surface in the Y-direction can be cleaned more effectively.

Figure 18A:
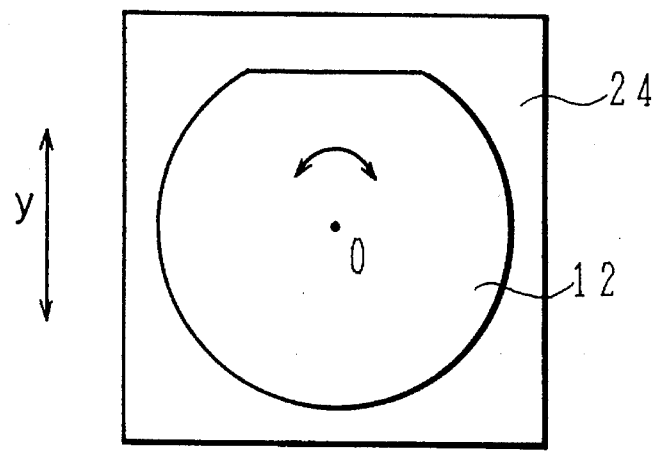
FIG. 18A is a schematic plan view explaining another drive method for the drive mechanism.
Figure 18B:
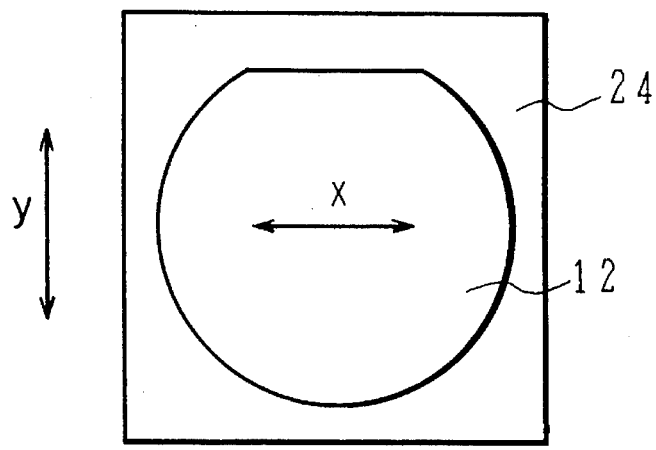
FIG. 18B is a schematic plan view explaining another drive method for the drive mechanism.

FIGS. 18A and 18B are plan views of a cleaning object 12 (e.g., semiconductor wafer) placed on a drive mechanism 24 in a vacuum chamber 11.

While moving the cleaning object 12 in the Y-direction, the drive mechanism 24 is rotated in the rotary angle range of about 10 degrees about a point 0 on the cleaning object. Similar to the embodiment shown in FIG. 17, improved cleaning effects can be obtained for the vertical surface in the Y-direction and other surfaces. The rotation center may be set outside of the surface of a cleaning object 12 to rotate it in a swing way.

If the drive mechanism 24 is reciprocally moved in the X-direction at a small amplitude as shown in FIG. 18B while moving the cleaning object in the Y-direction, the area cleaned by argon gas flows increases, providing improved cleaning effects and uniform cleaning of the cleaning object surface.

The above description of the embodiments, the disposal of nozzles, the number of nozzles, and tile nozzle diameter are merely illustrative and are not intended to be limitative, but they may be selected as desired depending upon the shape and size of a cleaning object and the dimension of a groove or projection on the surface of the cleaning object.

The surface of a cleaning object may be damaged, although it is cleaned, by blowing a fluid containing argon fine particles. In order to realize a superior cleaning of the surface of a cleaning object, it is desired to increase the cleaning power while suppressing surface damages. To this end, it is necessary to precisely control the liquified quantity of Ar gas in the mixed gas. It is conceivable for this purpose to control the cooling degree of the mixed gas by making constant the measured temperature of the cooled, mixed gas. With this method, however, precisely controlling the liquified quantity of Ar gas is difficult from the reasons stated below.

Figure 19A:
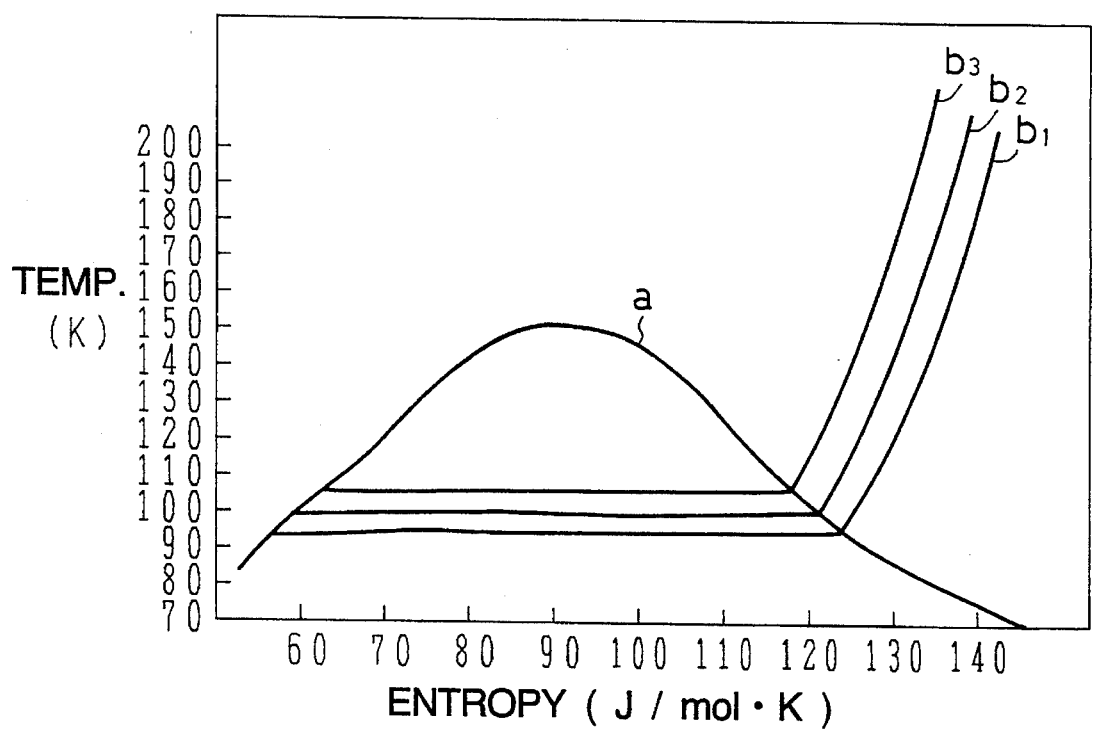
FIG. 19A is an argon phase diagram.

FIG. 19A is an argon phase diagram, the abscissa representing an entropy in the unit of Joule/tool * K and the ordinate representing a temperature in the unit of absolute temperature K. In FIG. 19A, a curve a indicates the liquefying temperature (gas/liquid interface). The region above the curve a corresponds to the gas phase, the region under the curve a corresponds the mixed state of the gas and liquid phases. Curves b1, b2, and b3 indicate the temperature changes for the liquefying temperatures of about 95K, 100K, and 105K under a constant pressure.

For example, in the case of the curve b1, as argon gas is cooled, the entropy reduces and temperature lowers, providing the curve falling down to the left. Liquefaction starts at the cross point between the curve b1 and curve a at a temperature of about 95K. As the cooling is performed Further, the entropy reduces but the temperature will not lower and takes a constant value. This is because the cooling is used not by lowering the temperature but by changing the phase from the gas phase to the liquid phase. The curves b2 and b3 also show the similar temperature changes, with different liquefying temperatures and pressures.

Therefore, after Ar gas reaches the liquefying temperature specific to its pressure and starts changing to argon droplets, the temperature of the argon gas rarely changes. As a result, it is difficult to detect the liquified quantity of Ar gas in the mixed gas, by measuring the argon gas temperature. According to the present invention, this problem can be solved by controlling the liquified quantity of Ar gas in the mixed gas by measuring the pressure of cooled Ar gas instead of measuring its temperature.

Figure 20:
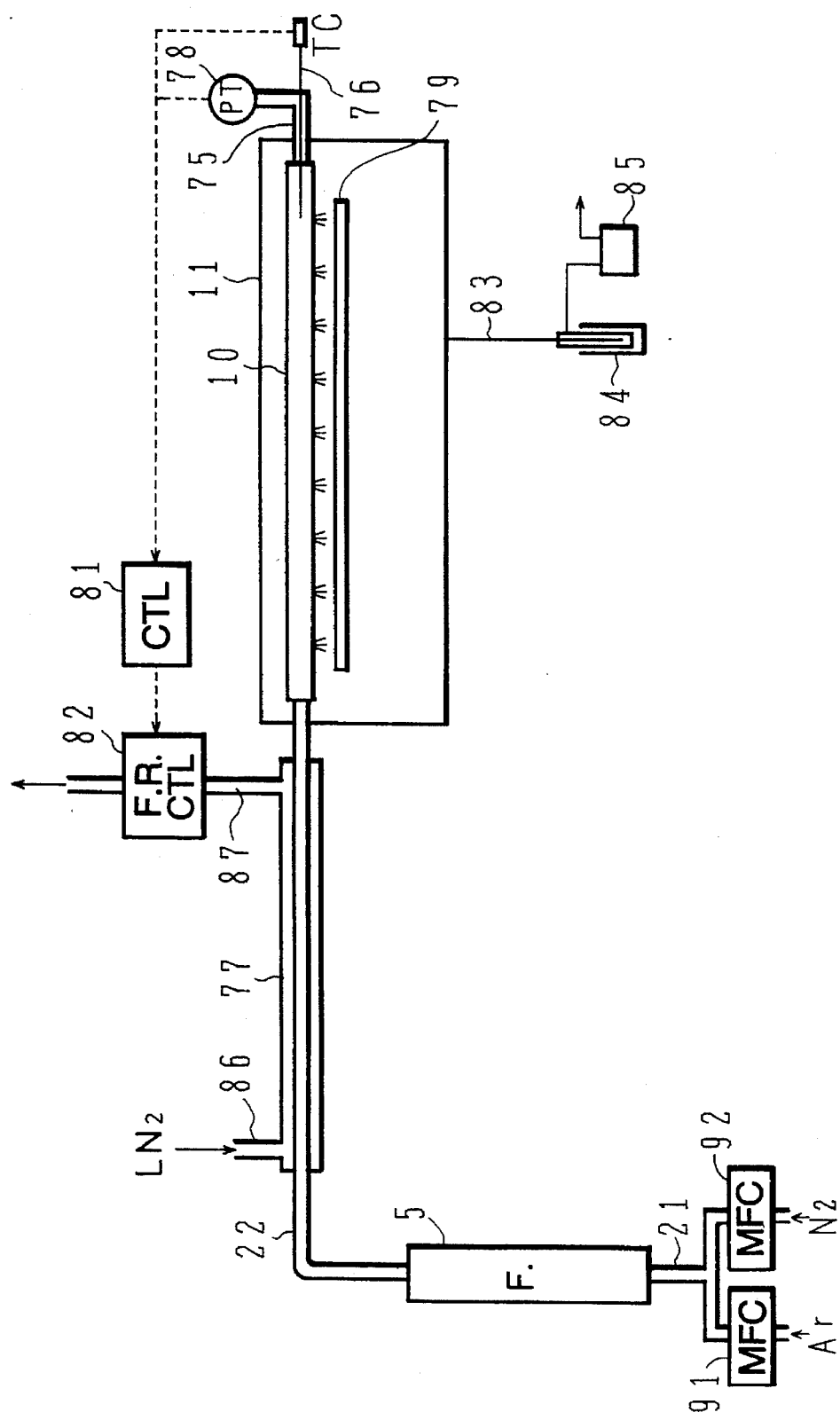
FIG. 20 is a schematic diagram showing the fundamental structure of the cleaning system according to a fourth embodiment of the present invention.

FIG. 20 shows the cleaning system according to the fourth embodiment of the present invention. Ar gas and $N_2$ gas regulated to have constant gas flows by mass flow controllers 91 and 92 are mixed. The mixed gas is supplied via a tube 21 to a filter 5. The mixed gas with foreign particles removed by the filter 5 is supplied via a tube 22 to a double-tube heat exchanger 77.

The double-tube heat exchanger 77 is supplied with liquid nitrogen from a tube 86. The liquid nitrogen cools the mixed gas supplied from the tube 22 to the liquefying temperature of Ar gas specific to its pressure. The liquid nitrogen partially or wholly changed to gas is exhausted from a tube 87. A flow controller 82 is set at the tube 87 for regulating the flow of the exhausted nitrogen gas and liquid nitrogen to a desired value.

The mixed gas supplied to the double-tube heat exchanger 77 is cooled to the liquefying temperature of Ar gas specific to its pressure, and fine droplets are supplied to a nozzle device 10 in a vacuum chamber 11. The tube interconnecting the double-tube heat exchanger 77 and nozzle device 10 is preferably a straight tube.

If the tube has a bent portion, it is difficult to perform a mirror surface polishing or electrolytic polishing and unable to prevent the generation of foreign particles at the uneven inner surface areas of the tube. A number of uneven areas are formed on the inner surface of the bend portion, so that many foreign particles are generated. A plurality of nozzles are formed in the nozzle device 10, and the cooled, mixed gas as well as argon droplets is blown from the nozzles into the vacuum chamber 11.

The nozzle device 10 is connected via a tube 75 to a pressure gauge 78 at the outside of the vacuum chamber 11 to measure the pressure of the inside of the nozzle device 10. A thermocouple 76 is inserted via the tube 75 into the nozzle device 10 to measure the temperature of the inside of the nozzle device 10.

A wafer table 79 is positioned under the nozzle device 10. The mixed gas containing argon fine particles is jetted out of nozzles to the surface of a cleaning object placed on the wafer table to clean the surface.

The vacuum chamber 11 is connected to a evacuating device 85 via a tube 88 and an oil trap 84 to evacuate the inside of the vacuum chamber 11. The oil trap 84 is used for preventing oil from counterflowing from the evacuating device 85. A dry pump may be used in order to reduce the oil counterflow.

The results measured by the pressure gauge 78 and thermocouple are sent to a controller 81 in the form of electric signals. The controller 81 controls tile flow to be controlled by the flow controller 82 by making the pressure of the inside of the nozzle device 10 set to a predetermined value.

Figure 19B:
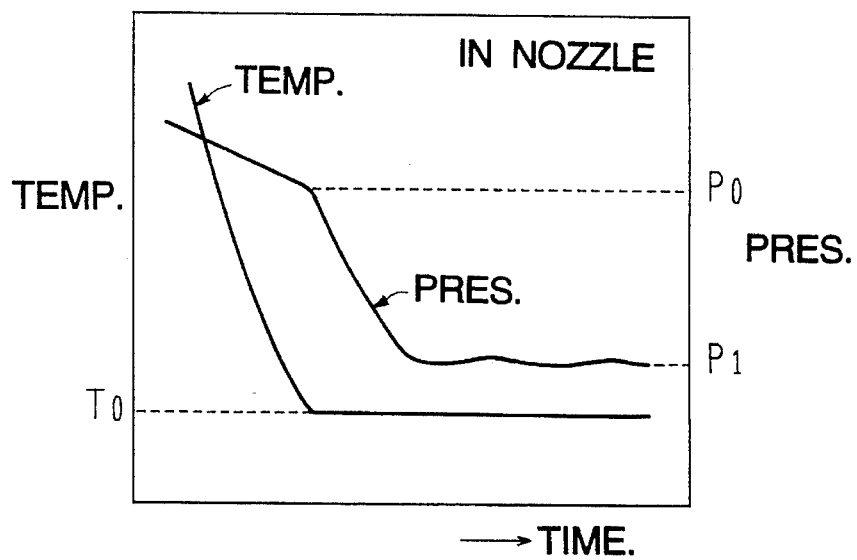
FIG. 19B is a graph showing the temperature and pressure of the inside of a nozzle header relative to time.

FIG. 19B is a graph showing the changes in the temperature and pressure of the inside of the nozzle device 10, the abscissa representing a time and the ordinate representing the temperature and pressure. As the mixed gas is cooled by the double-tube heat exchanger 77, the temperature of the inside of the nozzle device 10 lowers. After the mixed gas begins to liquefy at the temperature T0 and the pressure P0, the temperature change becomes very slower.

As the temperature lowers, the pressure reduces and reaches to a pressure P0 at the temperature T0. As the cooling further continues, the reduction rate of the pressure is speeded up because of the start of liquefying argon gas, and the pressure eventually reaches the predetermined pressure P1 set to the controller 11.

After the controller 81 detects that the pressure of the inside of the nozzle device 10 reaches P1, the flow to be controlled by the flow controller 82 is regulated by maintaining the pressure constant. Since a difference between P0 and P1 corresponds to the liquified quantity of Ar gas, this quantity can be estimated from the pressure difference. Therefore, by setting the pressure P1 to the predetermined value, it is possible to liquify the desired quantity of Ar gas. Since the pressure changes greatly with the liquified quantity, it is possible to control the liquified quantity of Ar gas with a small error.

If the liquified quantity of Ar gas is constant, the amount of argon fine particles jetted out of nozzles can be considered constant. Therefore, a desired amount of argon fine particles can be blown to the surface of a cleaning object. In this manner, the cleaning can be performed while maintaining the degree of damages on the object surface and the cleaning power at proper levels.

The cooling degree is regulated by making the flow off the mixed gas constant and detecting a change in the pressure, as explained with FIG. 19B. The flow of the mixed gas may be increased by setting the pressure to a desired value and making it constant.

Figure 19C:
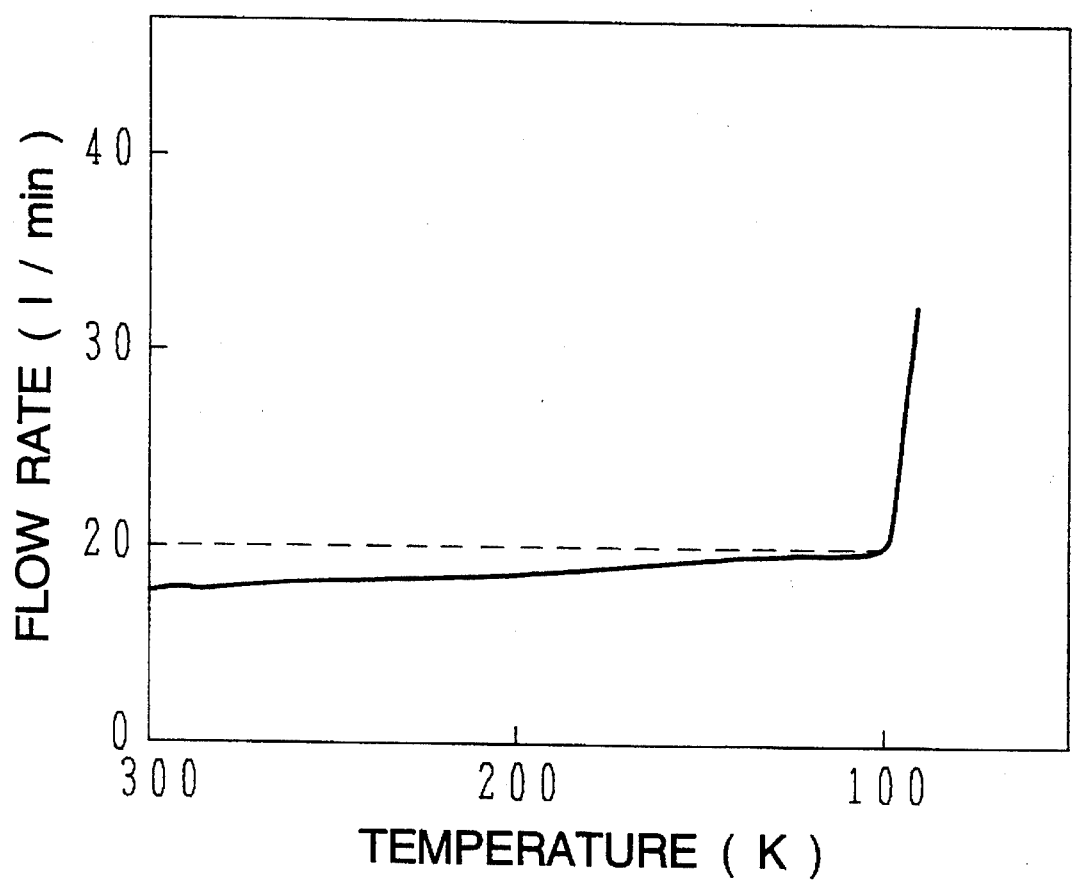
FIG. 19C is a graph showing the relationship between the cooled temperature and flow of a mixed gas containing argon gas.

FIG. 19C shows a change in the flow relative to the cooled temperature of the mixed gas when increasing the flow while making the pressure of the inside of a nozzle device constant. The abscissa represents the cooled temperate of the mixed gas in the unit of absolute temperature K, and the ordinate represents the total flow of argon gas and nitrogen gas in the unit of slm.

As the flow is increased gradually, the pressure of the inside of the nozzle device 10 rises. Because the pressure is controlled to be constant by the controller 81, the cooling degree is raised so that the temperate of the mixed gas lowers. In this manner, as the flow is increased gradually, the temperature of the cooled mixed gas lowers gradually.

When the temperature of the cooled, mixed gas reaches the liquefying temperature of argon gas specific to its pressure, argon gas starts being liquified. The temperature and flow of the mixed gas at the start of liquefying were about 100K and about 20 l/min in the case of this embodiment, although they change with the pressure of the inside of the nozzle device 10 and the nozzle shape.

As the flow is further increased, the cooling degree is raised by the control of the controller 81, enhancing the liquefying of argon gas. However, the temperature of the mixed gas becomes generally constant at the argon gas liquefying temperature. Therefore, after the mixed gas is cooled to the argon gas liquefying temperature, as shown in FIG. 19C the temperature of the mixed gas lowers only slightly and only the flow abruptly increases. This increase corresponds to the liquified quantity of argon gas.

It is therefore possible to calculate the liquified quantity of argon gas from a difference between the flow of the mixed gas used for the cleaning and the flow at the start of liquefying argon gas. In order to obtain good cleaning effects without giving large damages on the cleaning surface, it is preferable to set the flow of the mixed gas used for the cleaning 1.2 to 4 times the flow at the start of liquefying argon gas.

In the above embodiment, there has been described a method of controlling the cooling degree by changing the flow of $N_2$ gas on the exhaust side of the double-tube heat exchanger 77. The cooling degree may be controlled by other methods. For example, the flow of liquid nitrogen may be controlled by changing the pressure of the bomb containing liquid nitrogen.

Also in the above embodiment, as the cooling means, the double-tube heat exchanger using liquid nitrogen has been used. Other cooling means may also be used, such as a cryo-system including a Gifford McMohon cooler (GM cooler), a Stirling cooler, and a turbo cooler.

Figure 21A:
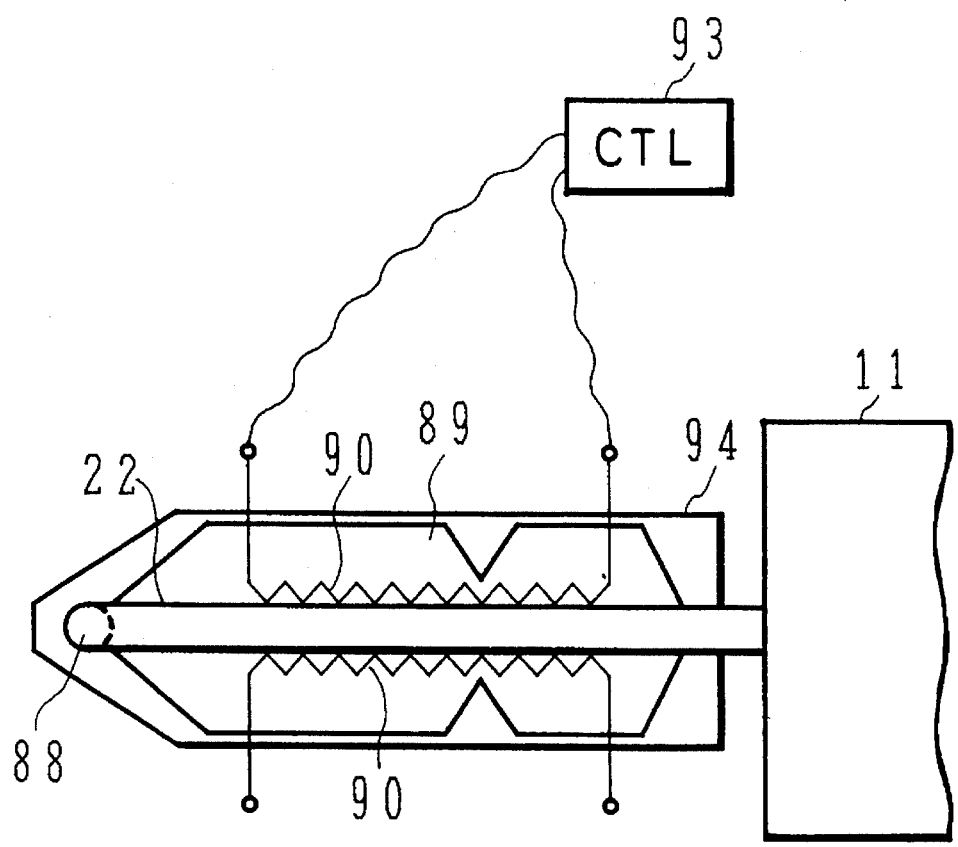
FIG. 21A is a schematic plan view showing the structure of a cooling means of the fourth embodiment.
Figure 21B:
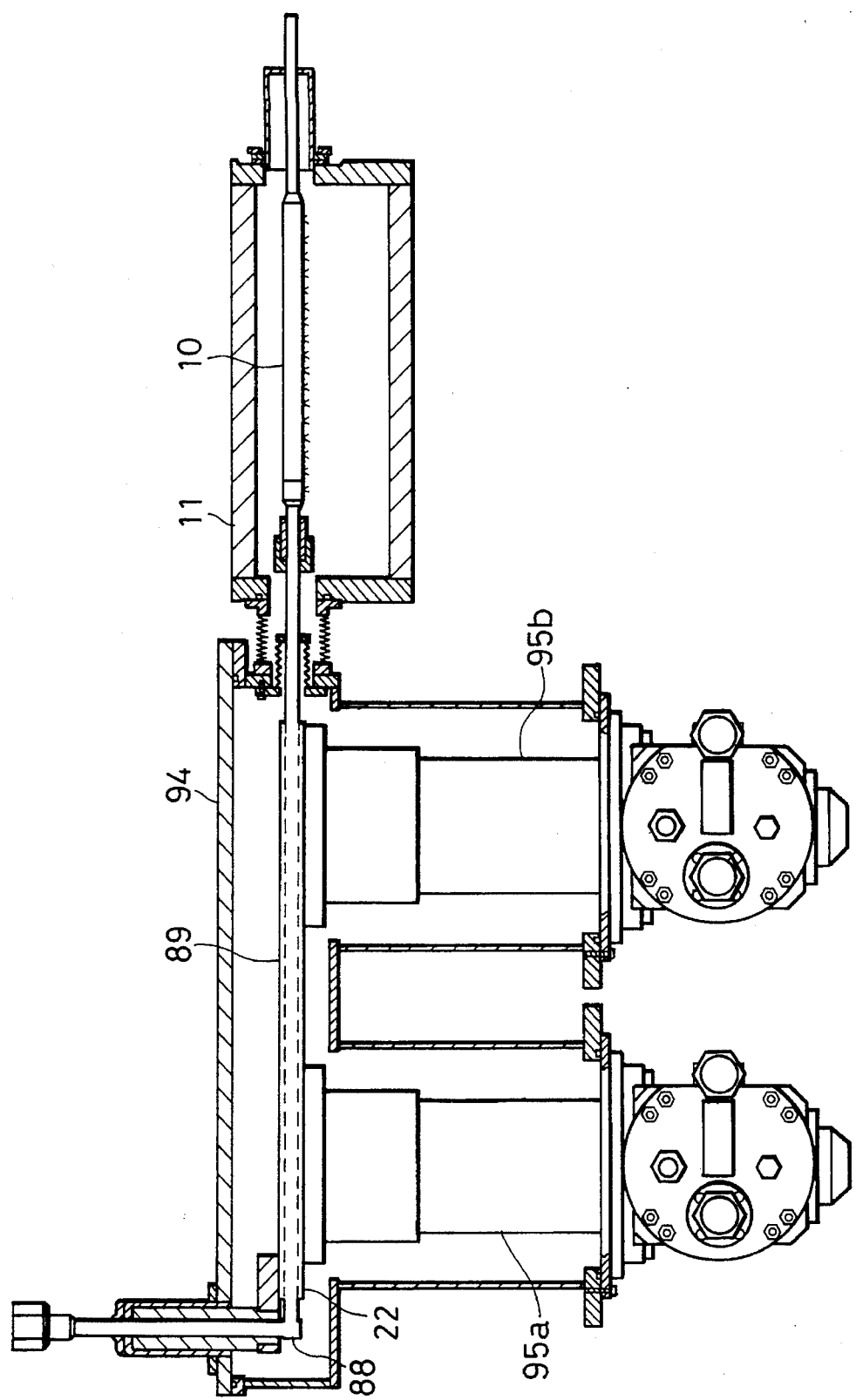
FIG. 21B is a schematic cross section showing the structure of another cooling means of the fourth embodiment.

FIGS. 21A and 21B show a cooling means using GM coolers. FIG. 21A is a plan view, and FIG. 21B is a side view. As shown in FIG. 21A, a mixed gas of Ar and $N_2$ gasses with foreign particles removed by a filter is supplied from a bending point 88 of a tube 22. The tube 22 between the bending point 88 and a vacuum chamber 11 contacts a cooling plate 89 of GM coolers at a high heat conduction. A heater 90 is mounted near the tube 22. The tube 22 from the bending point 88 to nozzles is made straight. As described with the embodiment shown in FIG. 20, the straight tube is effective for the prevention of foreign particles. The tube 22, cooling plate 89, and heater 90 are accommodated in the vacuum housing 94 for thermal isolation.

As shown in FIG. 21B, GM coolers 95a and 95b under the cooling plate 89 cool the plate 89. In FIG. 21, two GM coolers are connected in series to the tube 22. If the cooling power is sufficient, only one GM cooler may be used. If not sufficient, cooling by liquid nitrogen explained with FIG. 20 may be used together.

The heater 90 is connected to a controller 93 which controls the calorific power of the heater 90. The cooling degree of Ar gas can be controlled by regulating the calorific power of the heater 90. The controller 91 is supplied with an electric signal representing the measured pressure of the inside of the nozzle device. In accordance with this signal, the controller 91 regulates the calorific power of the heater 90.

The invention has been described in connection with the preferred embodiments. The invention is not limited only to the embodiments. For example, as the mixed gas, argon gas and inert gas having a lower liquefying temperature than argon gas may be used. Argon liquid (not droplet) may be supplied into the nozzle to be jetted out as argon droplets. In this case, the gas supplied into the nozzle may be argon, mixed gas containing argon, pure nitrogen, etc.

The cleaning object is not limited to semiconductor wafer, but other objects may be used for the surface cleaning at the manufacturing steps, including printed circuit boards, optical discs, magnetic discs, flat panels of liquid crystal displays, and flat panels of solar batteries.

It is apparent to those skilled in the art that various changes, improvements, combinations and the like can be made.

We claim:

1. In a surface cleaning method wherein argon is sprayed through a nozzle device onto the surface of an object to be cleaned, the improvement comprising:

an argon fine droplets forming step for forming argon liquid droplets upstream of the nozzle device comprising a cooling step to cool a gas containing an argon gas to the liquefying temperature of argon gas specific to the pressure of said argon gas, or lower, to form a fluid comprising said argon fine droplets and delivering said fluid containing the argon droplets into the nozzle device;

an argon fine particles forming step comprising jetting out the fluid containing argon liquid droplets from the nozzle device to a depressurized atmosphere and adiabatically expanding said fluid from the nozzle device in the depressurized atmosphere to solidify at least part of said argon liquid droplets into argon fine particles; and a blowing step of blowing said fluid containing said argon fine particles to the surface of the object to be cleaned.

2. A surface cleaning method according to claim 1, wherein said nozzle device and said object to be cleaned are housed in a vacuum chamber.

3. A surface cleaning method according to claim 2, wherein the pressure of the inside off said vacuum chamber is within a range from 0.2 atmospheric pressure to 0.68 atmospheric pressure.

4. A surface cleaning method according to claims 1, wherein said gas containing said argon gas is a mixed gas of argon gas and nitrogen gas, and the concentration of said nitrogen as is 2 to 70 mol %.

5. A surface cleaning method according to claim 1, wherein said argon fine particles have the surfaces of a solid phase and the inner regions of a liquid phase when colliding against the surface of said object to be cleaned.

6. A surface cleaning method according to claim 1, wherein said cooling step includes:
   a step of measuring the temperature of said gas containing said argon gas in said nozzle device and detecting when said temperature becomes generally constant and said argon fine droplets start forming in said gas containing said argon gas; and
   a step of measuring a first pressure of said gas in said nozzle device at the time when said temperature becomes generally constant, and controlling the cooling of said gas containing said argon gas to make said gas in said nozzle device have a constant second pressure lower than said first pressure.

7. A surface cleaning method according to claim 1, wherein said blowing step further includes a step of jetting out a gas from another nozzle device and blowing said gas to the surface of said, object to be cleaned.

8. A surface cleaning method according to claim 7, wherein said blowing step further includes a step of heating said gas jetted out of said other nozzle device.

9. A surface cleaning method according to claim 7, wherein said blowing step further includes a step of jetting out said gas from said other nozzle device and blowing said gas to the surface area of said cleaning object to which said fluid containing said argon fine particles jetted out of said nozzle device was blown.

10. A surface cleaning method according to claim 7, wherein said gas jetted out of said other nozzle is nitrogen gas.

11. A surface cleaning method according to claim 1, further comprising a step of providing a relative motion between said nozzle device and said object to be cleaned.

12. A surface cleaning method according to claim 11, wherein said nozzle device includes a plurality of nozzles disposed at generally an equal pitch in one direction, and said relative motion providing step provides a relative motion between said plurality of nozzles and said object to be cleaned in said one direction at high speed at a motion width equal to or greater than said equal pitch, and in another direction generally at a right angle relative said one direction at low speed.

13. A surface cleaning method according to claim 11, wherein said argon fine particle forming step includes:
   a step of jetting out said fluid containing said argon fine droplets in a first direction; and
   a step of jetting out said fluid containing said argon fine droplets in a second direction different from said first direction.

14. A surface cleaning method according to claim 13, wherein said first direction is opposite to said second direction in terms of projection to the surface of said object to be cleaned.

15. A surface cleaning method according to claim 14, wherein during said relative motion, said object to be cleaned is reciprocally moved at higher speed than said relative motion, in a direction intersecting said relative motion direction.

16. A surface cleaning method according to claim 14, wherein during said relative motion, said object to be cleaned is rotated about the center axis of said object to be cleaned.

17. A surface cleaning method according to claim 11, wherein:
said relative motion providing step includes a step of reciprocally moving said object to be cleaned; and
said blowing step includes:
   a step of jetting out said fluid containing said argon fine particles from a plurality of nozzles disposed on said nozzle device at generally an equal pitch in a direction perpendicular to the direction of reciprocally moving said object to be cleaned, and blowing said fluid in a first direction obliquely down to the surface of said object to be cleaned in the forward direction of said object to be cleaned; and
   a step of jetting out said fluid containing argon particles from said plurality of nozzles and blowing said fluid in a second direction obliquely down to the surface of said object to be cleaned in the backward direction of said object to be cleaned, said first and second directions being opposite in terms of projection to the surface of said object to be cleaned.

18. A surface cleaning method according to claim 1, wherein said cooling step includes:
   cooling said gas containing said argon gas and gradually increasing the mol flow of said gas containing said argon gas, to maintain the pressure inside of said nozzle device to be substantially constant, until liquefication of the argon begins as determined by a rapid increase in mol flow of said gas; and, thereafter
   controlling the mol flow of the liquefied argon by further increasing the mol flow of the gas containing said argon gas while further cooling said gas containing the argon gas to maintain the pressure inside of the nozzle device to be substantially constant.

19. A surface cleaning method according to claims 18, wherein said gas containing said argon gas is a mixed gas of argon gas and nitrogen gas, and the concentration of said nitrogen gas is 2 to 70 mol %.

20. A surface cleaning method according to claim 19, wherein the pressure of said gas containing said argon gas in said nozzle device is within a range from 3 atmospheric pressures to 7 atmospheric pressures.

21. A surface cleaning method according to claim 18, wherein the pressure of the inside of said nozzle device is within a range from 3 atmospheric pressures to 7 atmospheric pressures.

22. A surface cleaning method according to claim 18, wherein said second mol flow is within a range from 1.2 times said first mol flow to 4 times said first mol flow.

23. A surface cleaning method according to claim 18, wherein said cooling step further includes, after said controlling step, controlling the cooling of said gas containing said argon gas to maintain the mol flow of the gas containing said argon gas and the pressure inside of the nozzle device, to be substantially constant.

24. In a surface cleaning method, wherein argon is sprayed through a nozzle device onto the surface of an object to be cleaned, the improvement comprising:
   an argon fine droplets forming step comprising heating a stream of liquid argon to form a fluid comprising a stream of argon gas containing argon liquid droplets;
   an argon fine particles forming step comprising jetting out the fluid of argon gas containing argon liquid droplets from the nozzle device to a depressurized atmosphere and adiabatically expanding said fluid from the nozzle device in the depressurized atmosphere to solidify at least part of said argon liquid droplets into argon fine particles; and
   a blowing step of blowing said fluid containing said argon fine particles to the surface of the object to be cleaned.

25. In a surface cleaning method, wherein argon is sprayed through a nozzle device onto the surface of an object to be cleaned, the improvement comprising:

an argon fine droplets forming step comprising mixing a stream of liquid argon with gas to form a fluid comprising a stream of gas containing argon liquid droplets;

an argon fine particles forming step comprising jetting out the fluid of gas containing argon liquid droplets from the nozzle device to depressurized atmosphere and adiabatically expanding said fluid from the nozzle device in the depressurized atmosphere to solidify at least part of said argon liquid droplets into argon fine particles; and a blowing step of blowing said fluid containing said argon fine particles to the surface of the object to be cleaned.

26. The surface cleaning method according to claim 25, wherein said gas is nitrogen.

* * * * *